US011966718B2

(12) United States Patent
Inoue et al.

(10) Patent No.: US 11,966,718 B2
(45) Date of Patent: Apr. 23, 2024

(54) VIRTUAL DEVELOPMENTAL ENVIRONMENT APPARATUS, METHOD, AND RECORDING MEDIUM

(71) Applicant: RENESAS ELECTRONICS CORPORATION, Tokyo (JP)

(72) Inventors: Mitsugu Inoue, Tokyo (JP); Koichi Sato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 140 days.

(21) Appl. No.: 17/835,556

(22) Filed: Jun. 8, 2022

(65) Prior Publication Data

US 2023/0013854 A1    Jan. 19, 2023

(30) Foreign Application Priority Data

Jul. 13, 2021    (JP) ................................ 2021-116022

(51) Int. Cl.
  *G06F 8/20*    (2018.01)
  *G06F 13/40*   (2006.01)
(52) U.S. Cl.
  CPC ............ *G06F 8/20* (2013.01); *G06F 13/4027* (2013.01)
(58) Field of Classification Search
  None
  See application file for complete search history.

(56) References Cited

U.S. PATENT DOCUMENTS

| 2010/0058290 A1* | 3/2010 | Williamson | G06F 8/20 |
| | | | 717/106 |
| 2018/0137022 A1* | 5/2018 | Funabashi | G06F 11/36 |
| 2019/0138671 A1* | 5/2019 | Funabashi | G06F 30/20 |
| 2021/0165748 A1* | 6/2021 | Suevern | G06F 11/3664 |
| 2022/0300316 A1* | 9/2022 | Tamano | G06F 9/45558 |
| 2023/0369915 A1* | 11/2023 | Wei | H02J 50/10 |

FOREIGN PATENT DOCUMENTS

| CN | 115617009 A * | 1/2023 | ......... G06F 13/4027 |
| DE | 102019219067 A1 * | 6/2021 | |
| JP | 2018-081400 A | 5/2018 | |

OTHER PUBLICATIONS

Extended European Search Report issued in corresponding European Patent Application No. 22183361.9-1224, dated Feb. 16, 2023.

(Continued)

*Primary Examiner* — Philip Wang
(74) *Attorney, Agent, or Firm* — Rimon P.C.

(57) ABSTRACT

Placement of bridges connecting CAE tools and virtual ECU simulation tools is facilitated. A virtual developmental environment apparatus includes a processing execution unit and a memory for storing a MILS model including a controller block and a plant block, first setting information, a program for realizing a function in the controller block used in executing simulation of the virtual ECU, and second setting information. The processing execution unit identifies a controller block in the MILS model based on the first setting information, arranges a bridge for connecting the input port and the output port and the I/O port of the virtual ECU to the input port and the output port of the identified controller block, and connects the bridge and the I/O port of the virtual ECU based on the second setting information.

12 Claims, 20 Drawing Sheets

(56) References Cited

OTHER PUBLICATIONS

Figure 1:
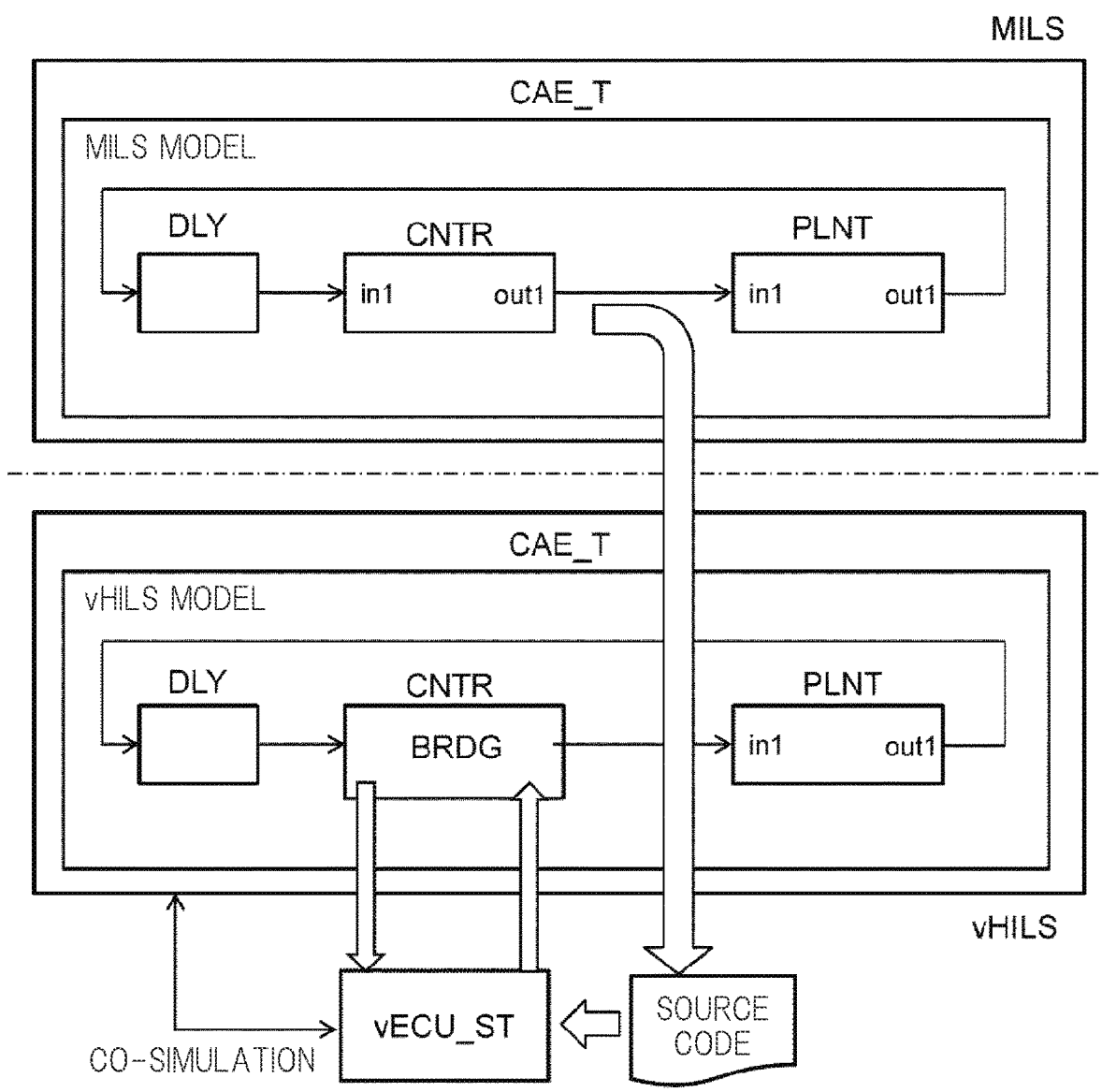

Shivanandaswamy Kushal Koppa et al., "Emphasis on Evaluative Prerequisites for Decisive Software-in-the-Loop (SiL) Environments", 2021 8th International Conference on Computing for Sustainable Global Development (INDIACOM), Bharati Vidyapeeth, New Delhi, Mar. 17, 2021 (Mar. 17, 2021), pp. 450-457.

Peter Baumann et al., "Towards virtual validation of distributed functions", Jul. 22, 2019; Jul. 22, 2019- Jul. 24, 2019, Jul. 22, 2019 (Jul. 22, 2019), pp. 1-12.

Dspace Group: "Virtual Validation—Creating a Simulation System", Jun. 30, 2015 (Jun. 30, 2015), XP093019786, Retrieved from the Internet: URL:https://www.youtube.com/watch?v=svoNn_XaAxk [retrived on Feb. 1, 2023].

\* cited by examiner

VIRTUAL DEVELOPMENTAL ENVIRONMENT APPARATUS, METHOD, AND RECORDING MEDIUM

CROSS-REFERENCE TO RELATED APPLICATION

This disclosure of Japanese Patent Application No. 2021-116022 filed on Jul. 13, 2021 including the specification, drawings and abstract is incorporated herein by reference in its entirety.

BACKGROUND

The present disclosure relates to a virtual developmental environment apparatus. The present disclosure is applicable to a virtual developmental environment apparatus using a virtual environment called, for example, vHILS (Virtual Hardware In the Loop Simulation).

MBD (Model Based Development) has been widespread in developing software for controllers such as ECU (Electronic Control Unit) in development of control systems. A control unit and a function of the control object are modeled using CAE (Computer Aided Engineering) tools such as MATLAB (registered trademark)/Simulink (registered trademark). MBD is a development method aimed at improving quality and development efficiency throughout the product lifecycle by using these models as a specification. MBD is also carried out in accordance with a development process called V-type development process.

Among the V-type development processes, there are MILS (Model In the Loop Simulation) and HILS (Hardware In the Loop Simulation) as the processes in which computer simulation plays a critical role. In MILS, the function of the control unit and the function of the control object called the plant are modeled, and MILS modeling which combines them verified. HILS is simulated using ECUs be implemented. In HILS, ECUs are verified by combining the actual ECU with the model of the plant.

If the performance of the ECU is found to be unreachable in the performance verification of HILS, ECU must be designed again. The redesign of the ECU requires time and effort. Therefore, vHILS is used instead of HILS. vHILS is a simulated HILS that is virtualized using the model (virtual ECU) of the ECU to be implemented. In vHILS, the software code generated from MILS is used and validated using a virtual ECU simulation tool. This reduces the time required to return to redesign.

There is a disclosed technique listed below.
[Patent Document 1] Japanese Unexamined Patent Application Publication No. 2018-81400

Patent Document 1 discloses the following. By using the virtual device model (virtual ECU) of ECU beings developed and the system test program of the ECU, the system control application program of the ECU is developed and verified.

SUMMARY

The task of constructing vHILS infrastructure from MILS is manual, and the redesign effort remains. The connection between the CAE tool and the virtual ECU simulation tool requires a bridge. Users must manually place this bridge in MILS modeling. In addition, the user must manually configure the settings for connecting the signal lines of the I/O (Input/Output) ports of the virtual ECUs to the arranged bridges.

Other problems and novel features will become apparent from the description herein and from the accompanying drawings.

A brief summary of representative of the present disclosure is as follows. In other words, a virtual developmental environment apparatus is equipped with a vHILS infrastructure management tool and it automatically arranges bridges required to perform vHILS and sets the bridges to be connected.

BRIEF DESCRIPTIONS OF THE DRAWINGS

Figure 2:
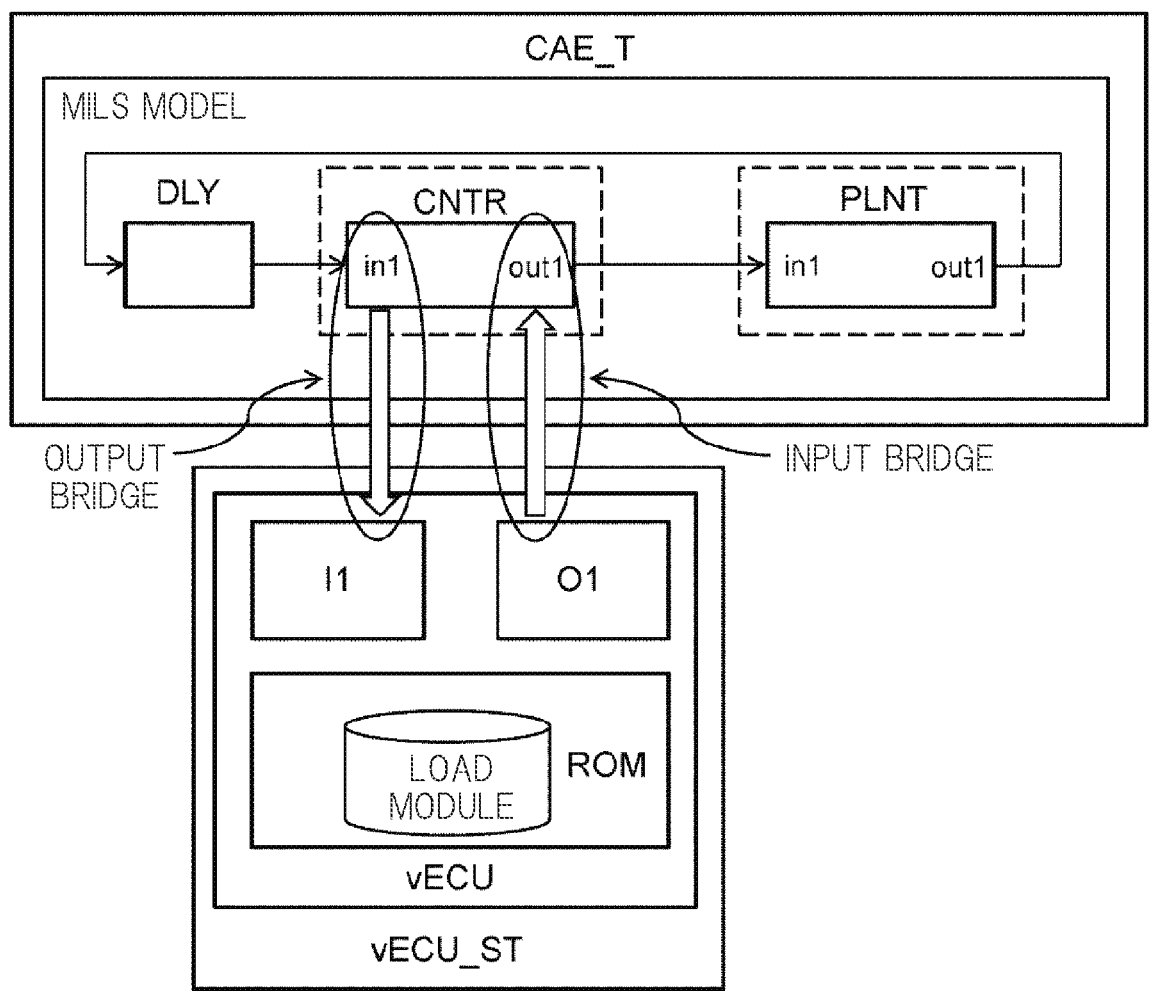
Figure 3:
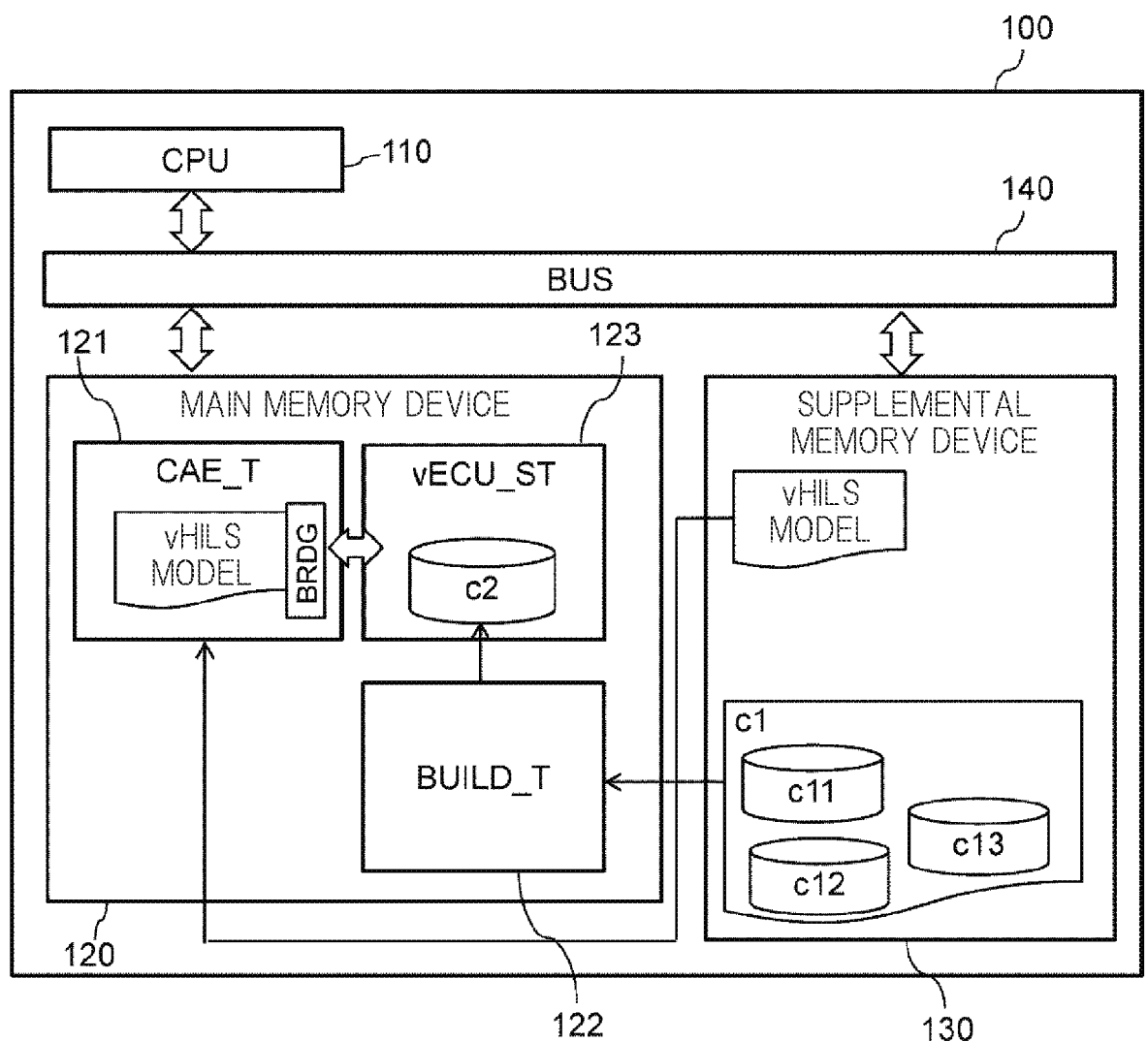
Figure 4:
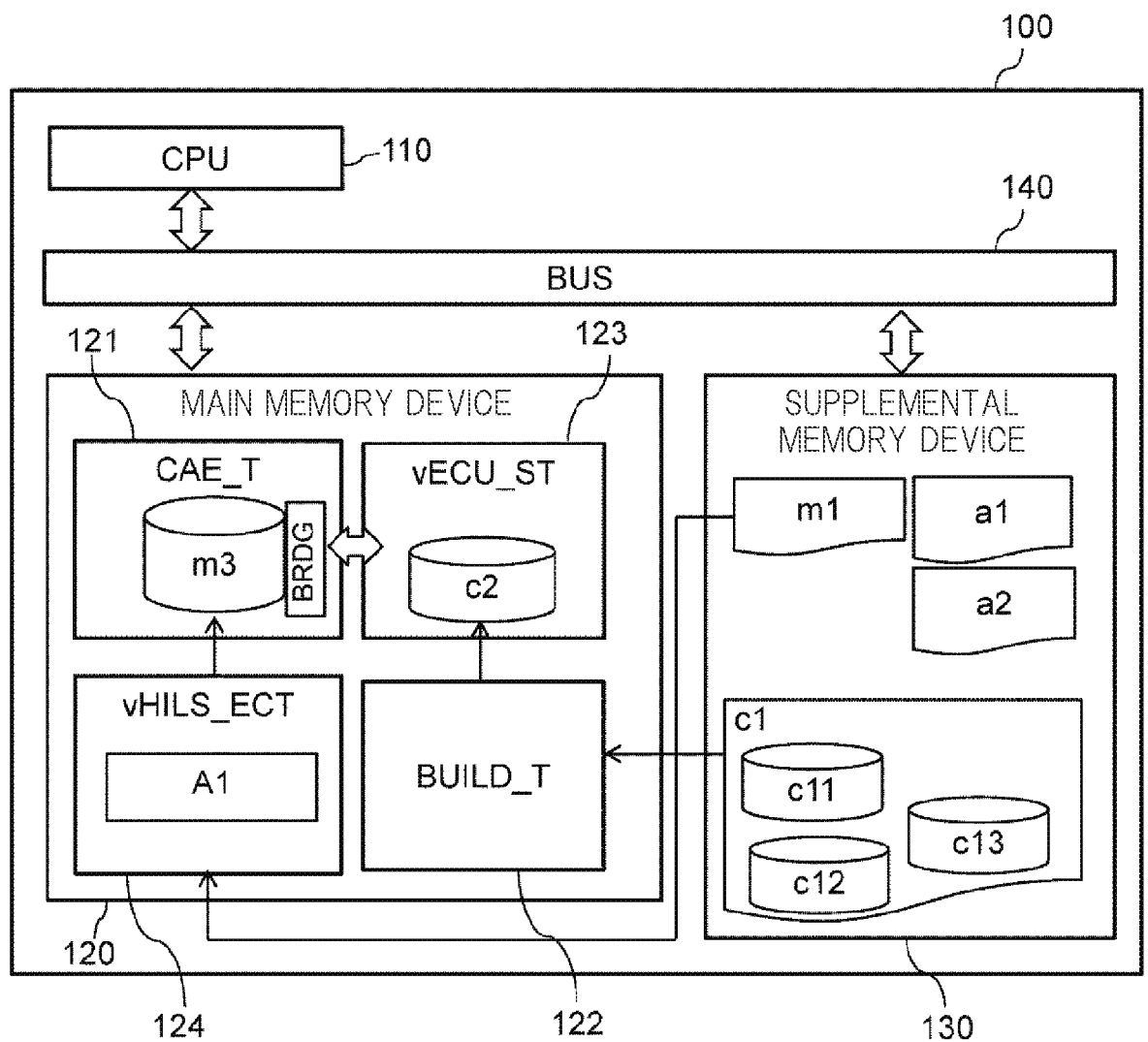
Figure 5:
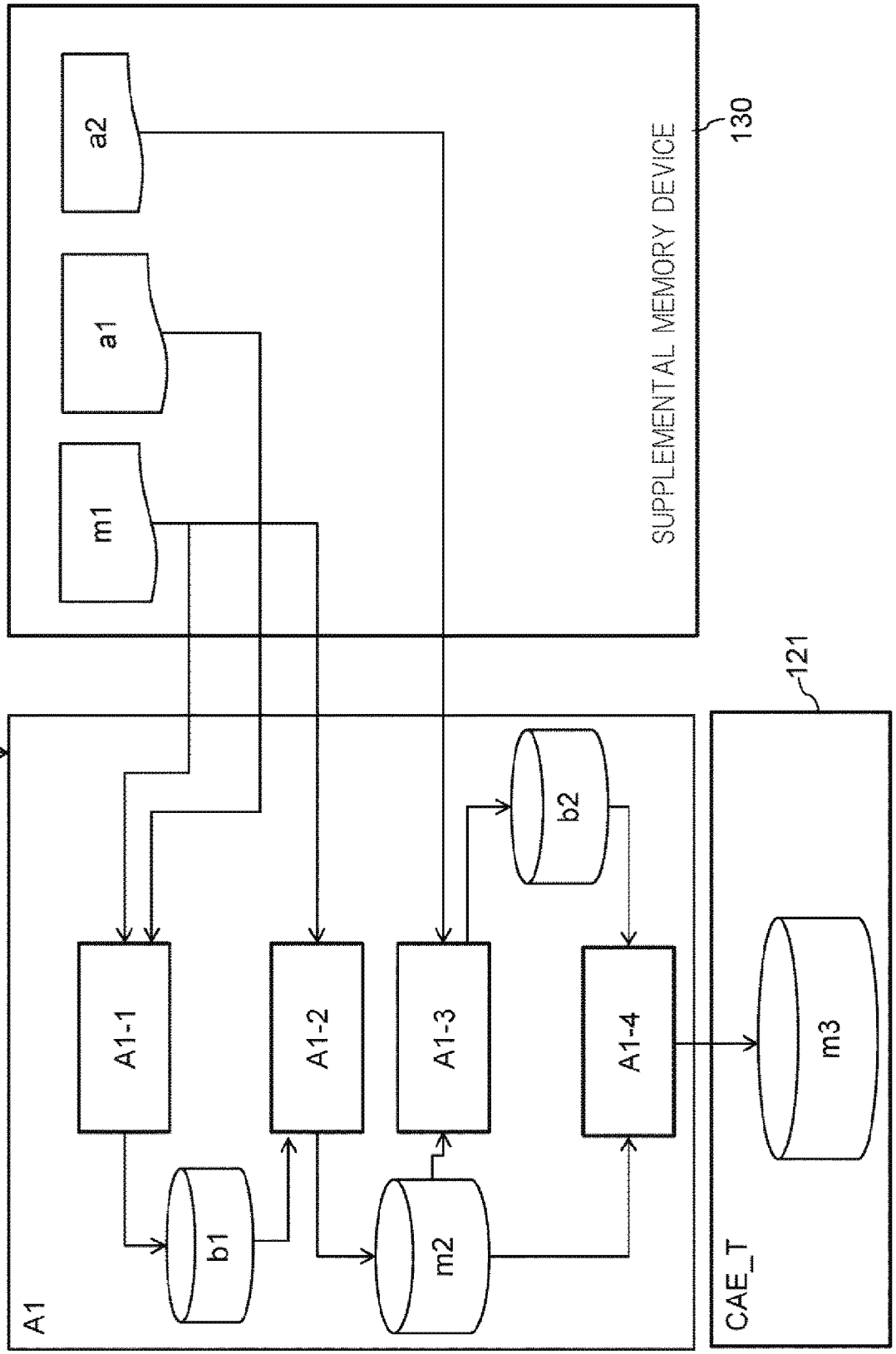
Figure 6:
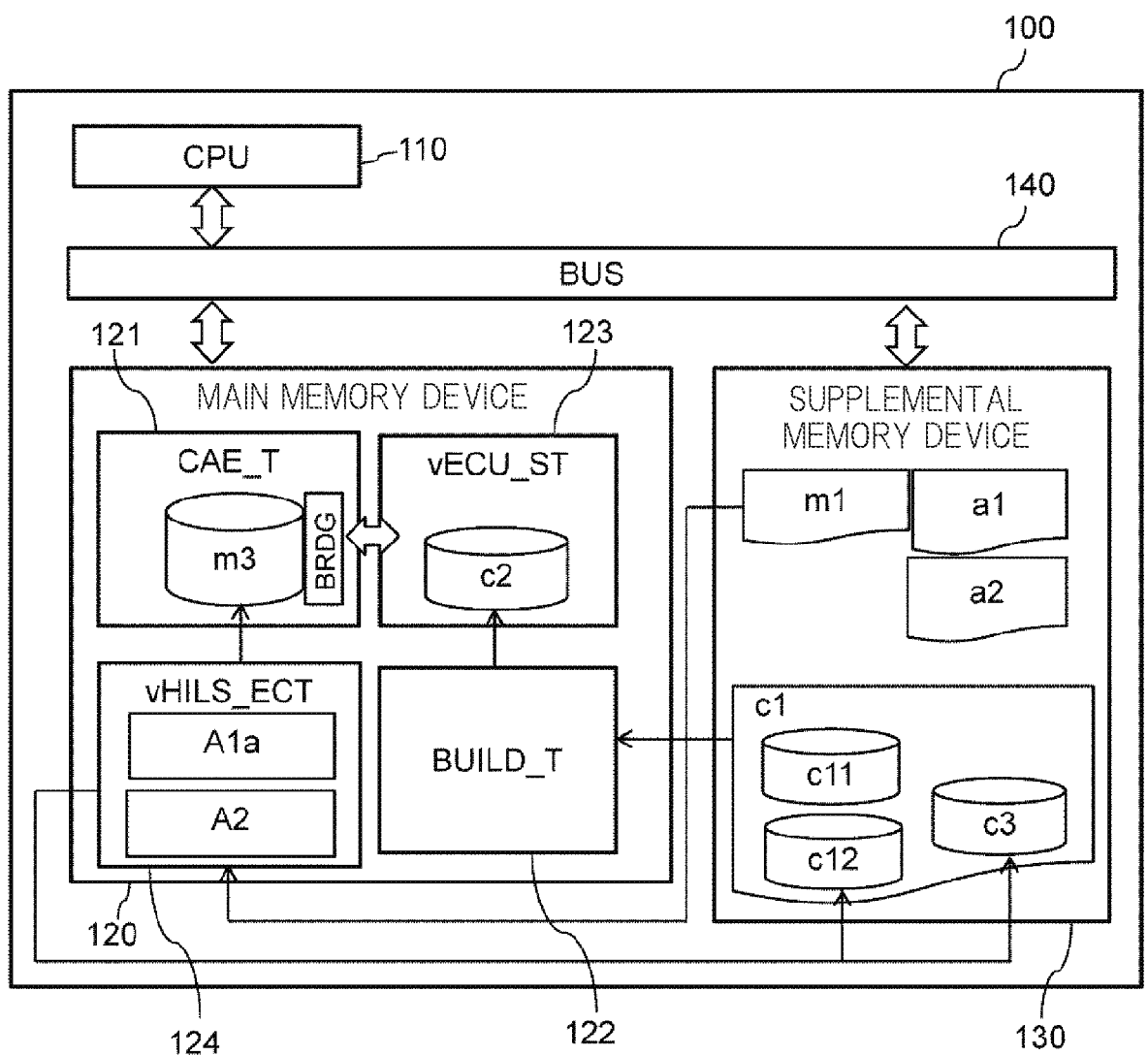
Figure 7:
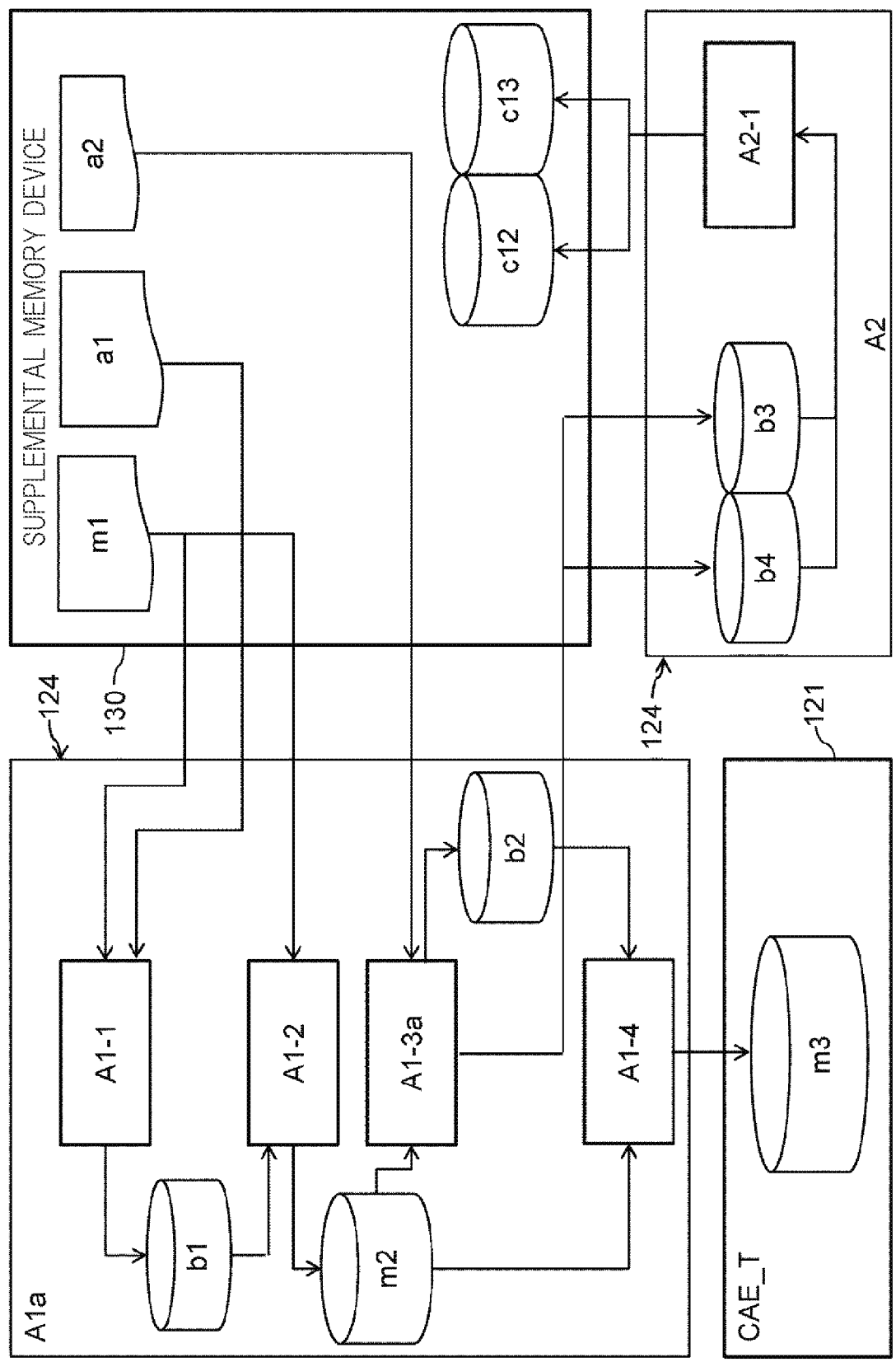
Figure 8:
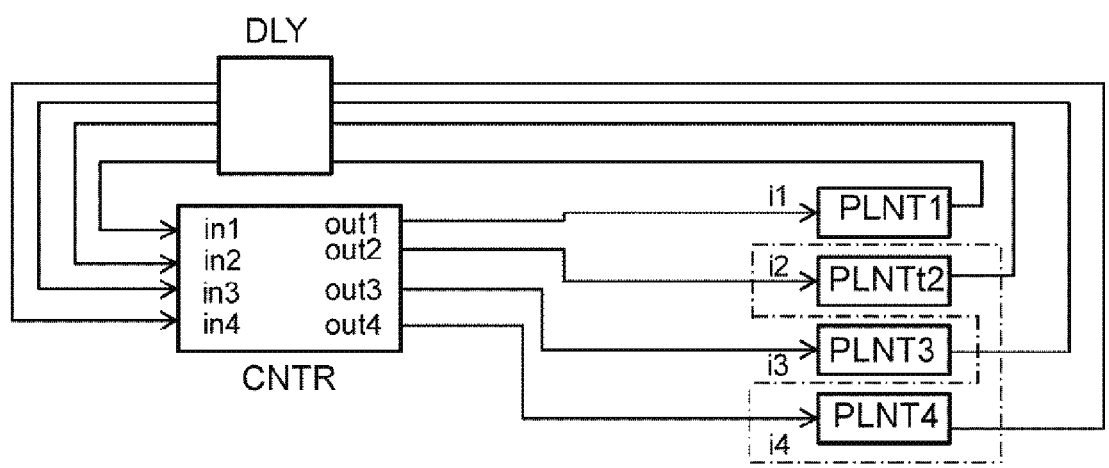
Figure 9:
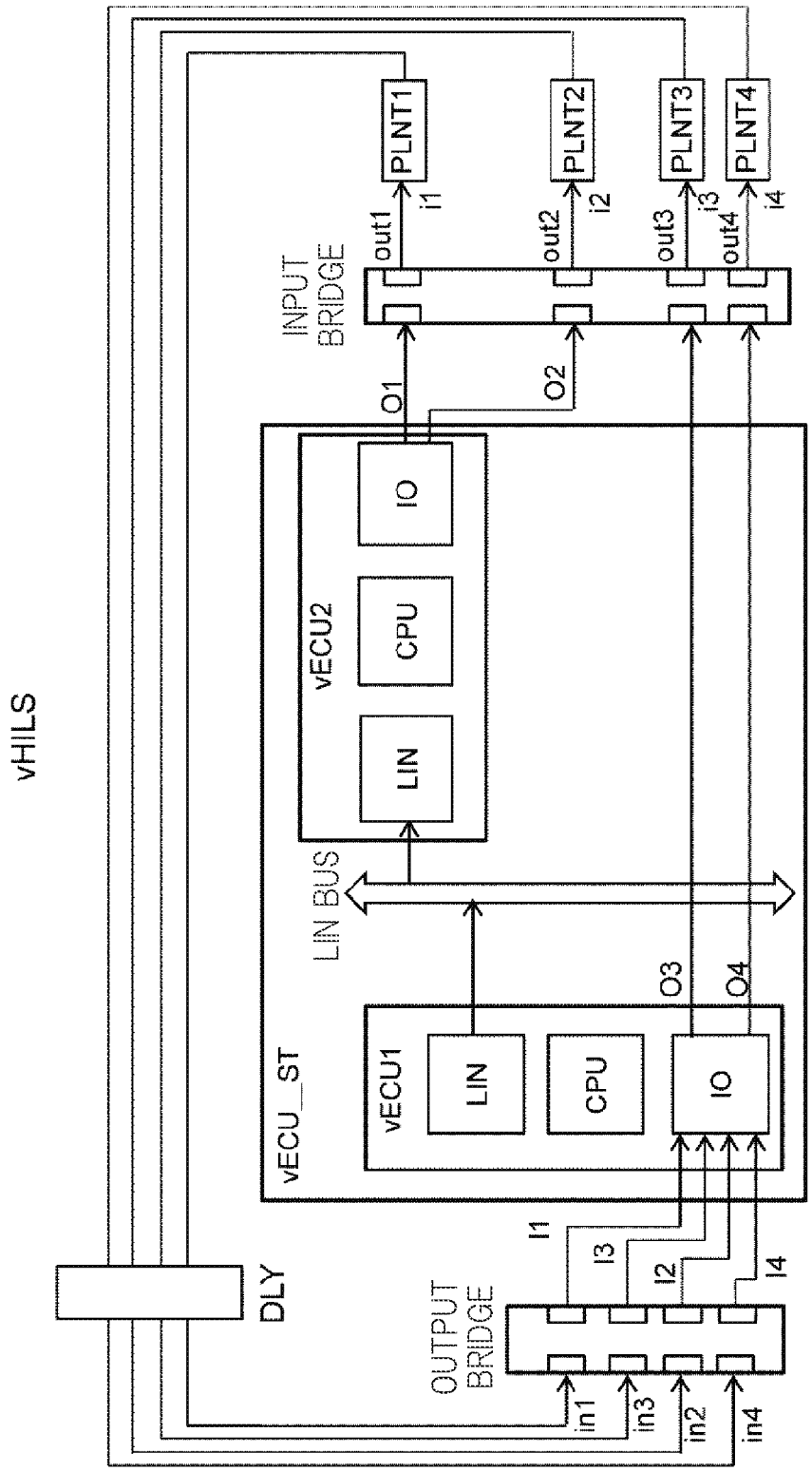
Figure 10:
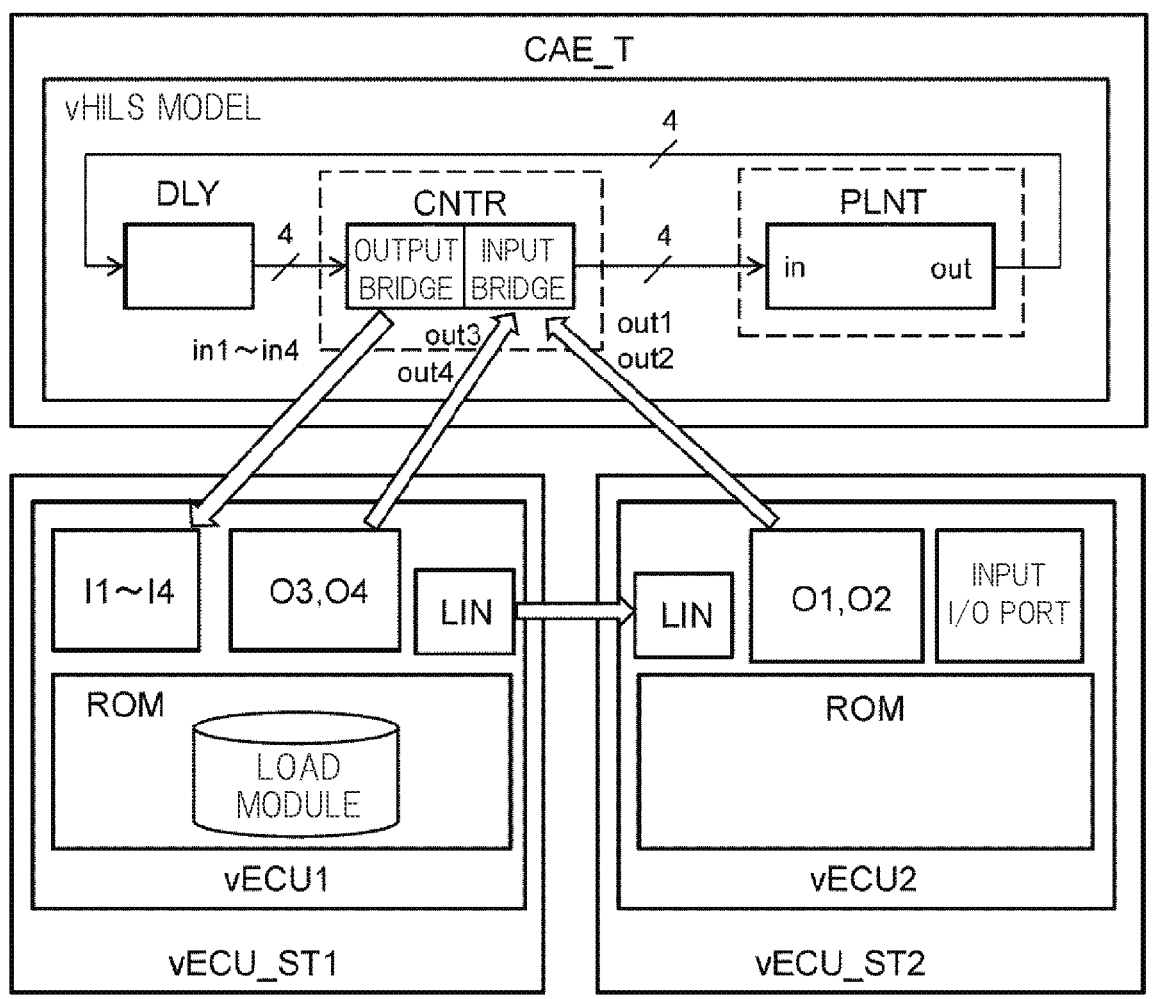
Figure 11:
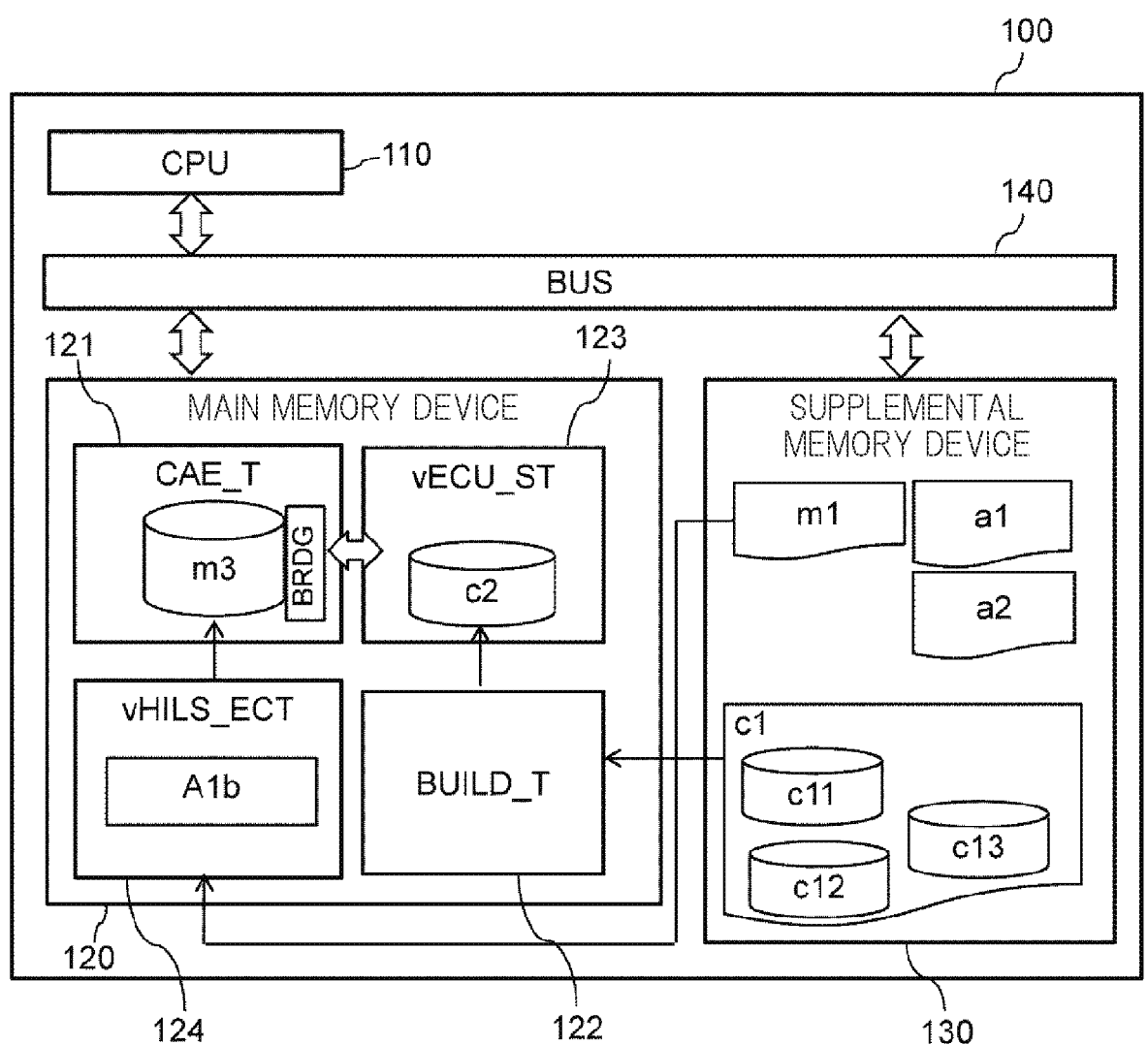
Figure 12:
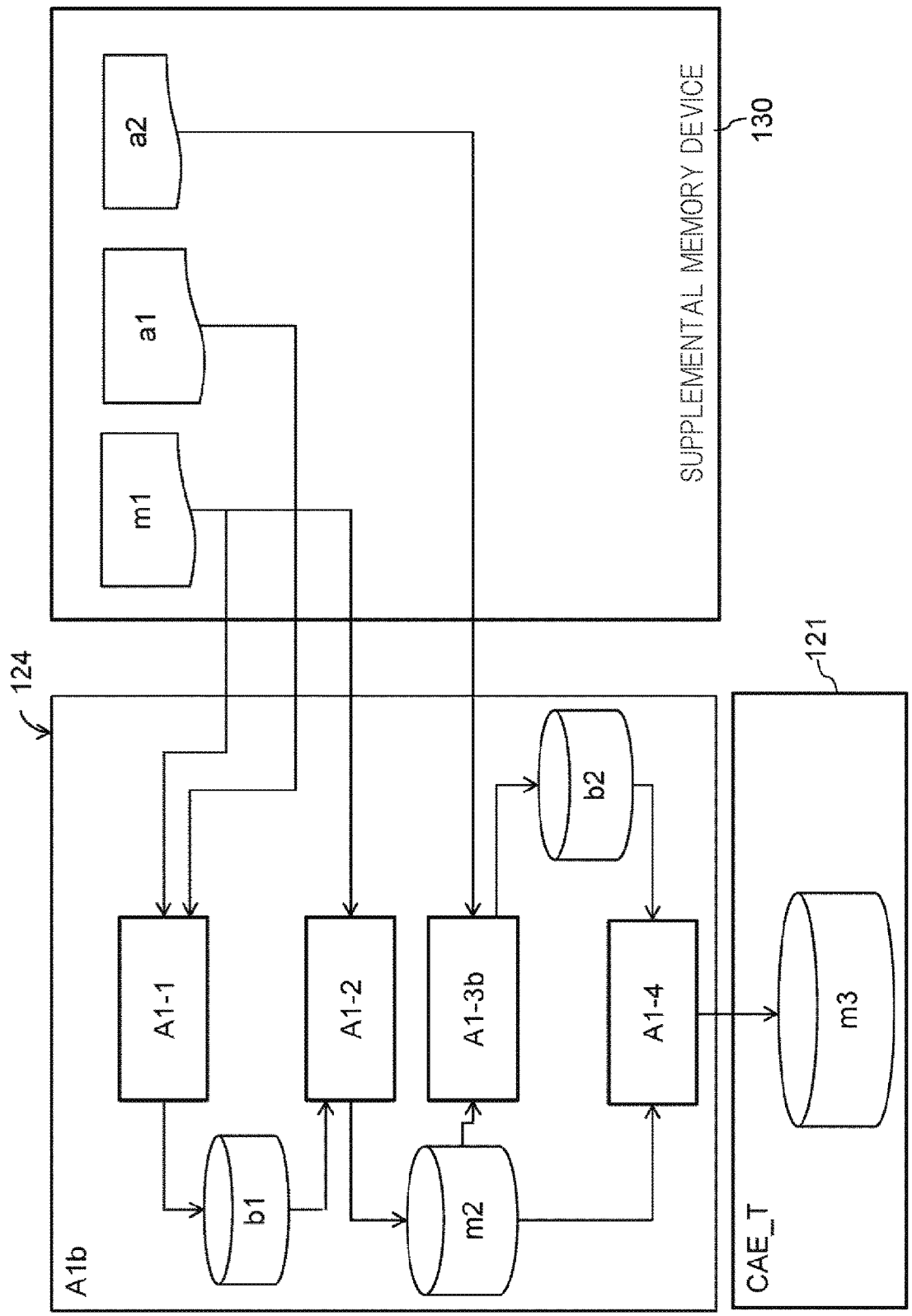
Figure 13:
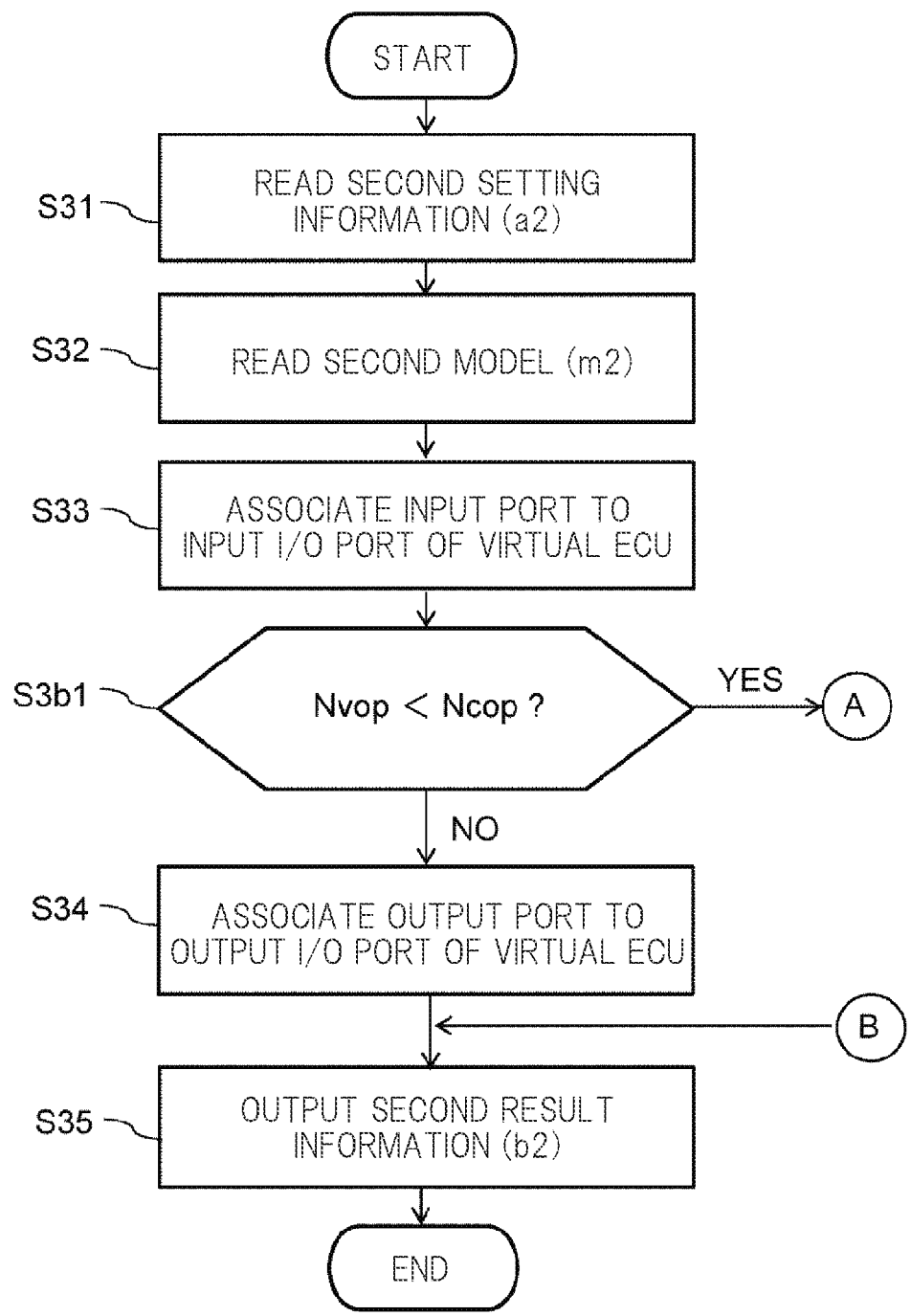
Figure 14:
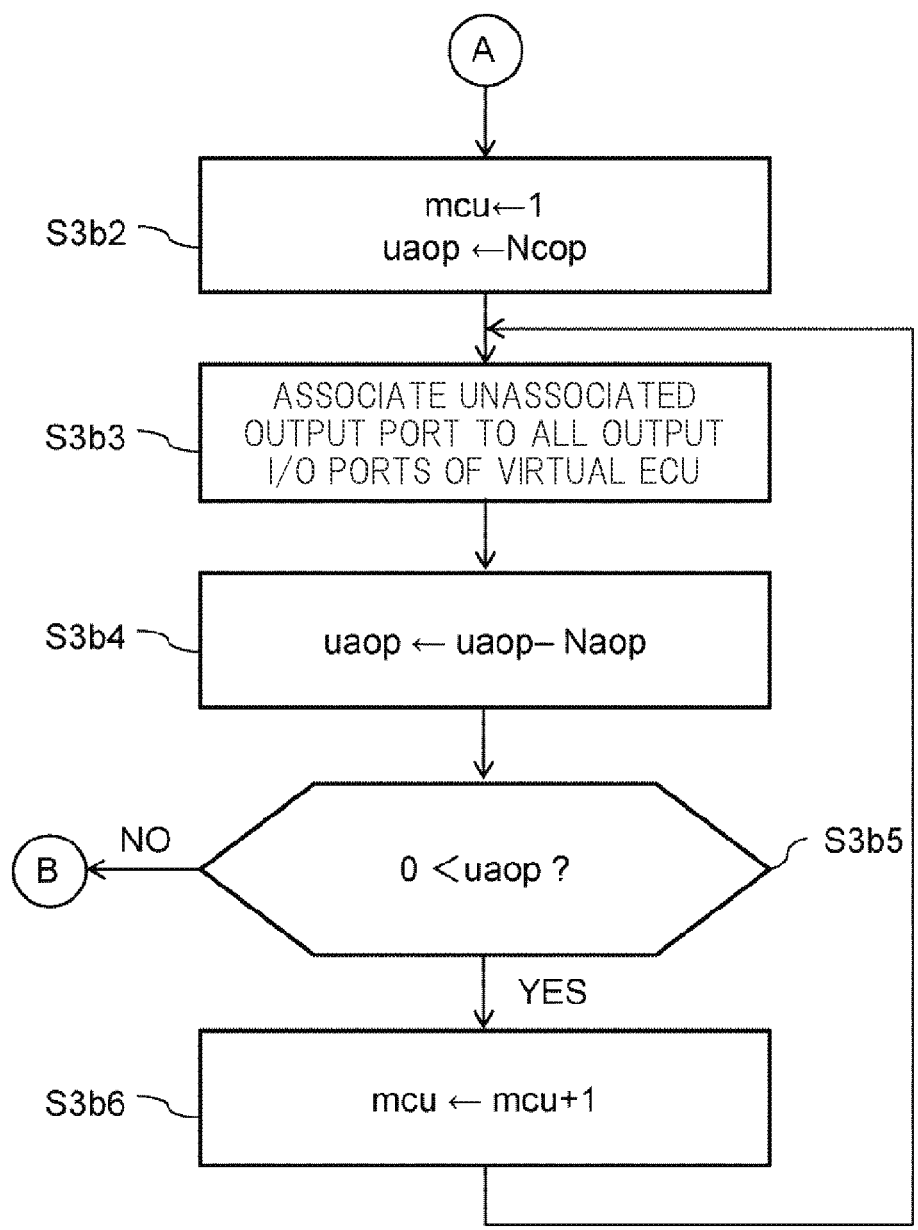
Figure 15:
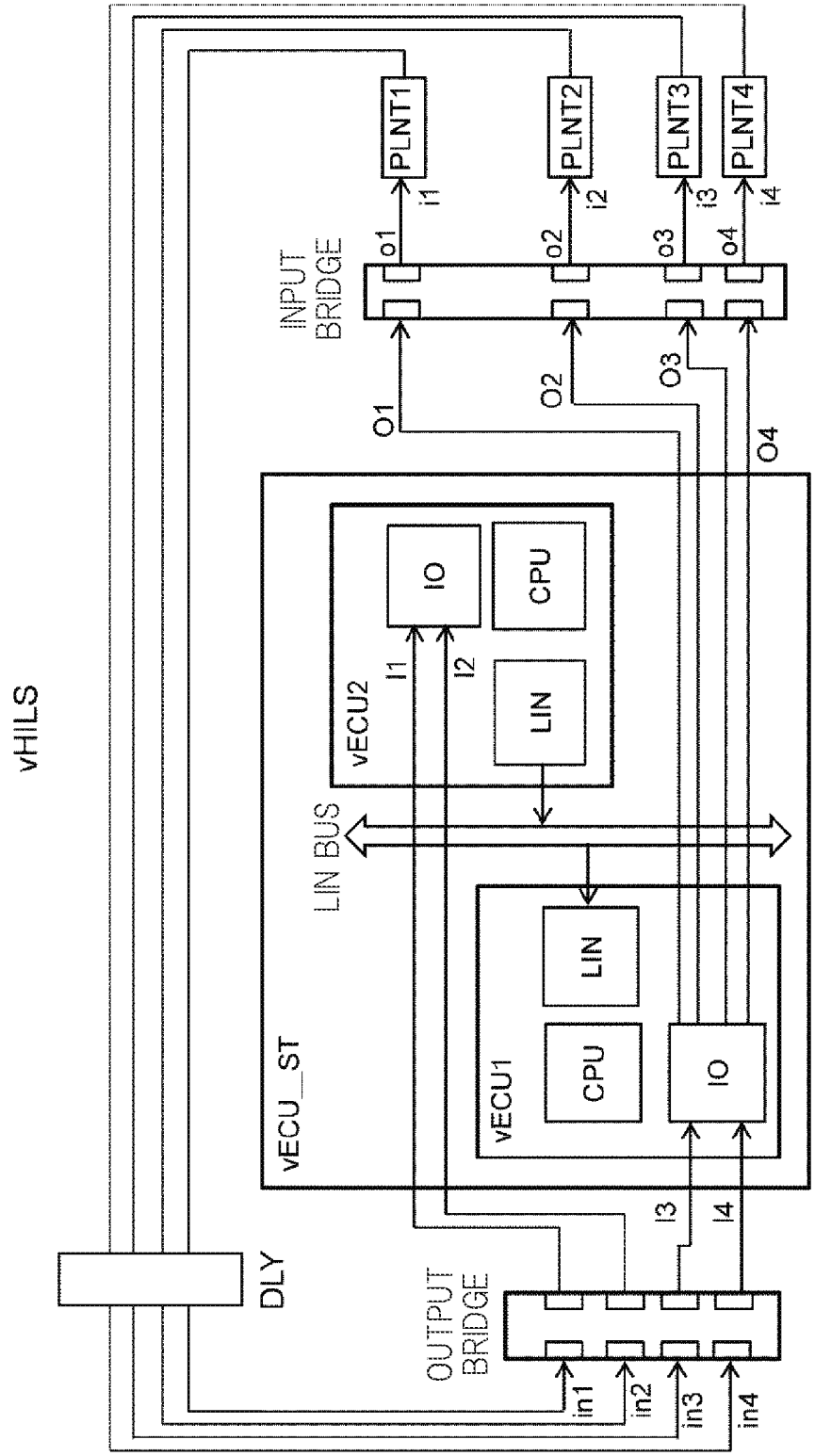
Figure 16:
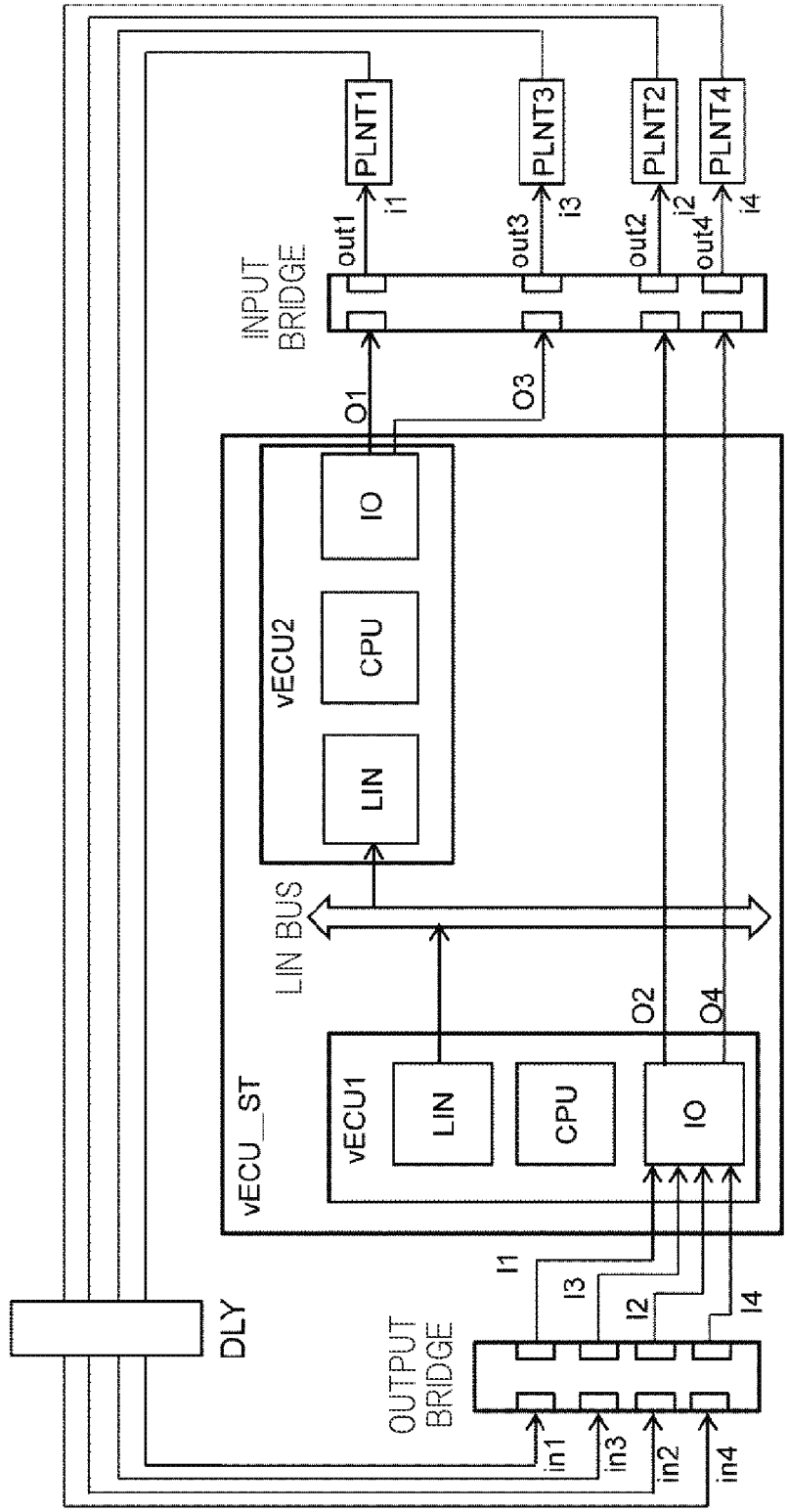
Figure 17:
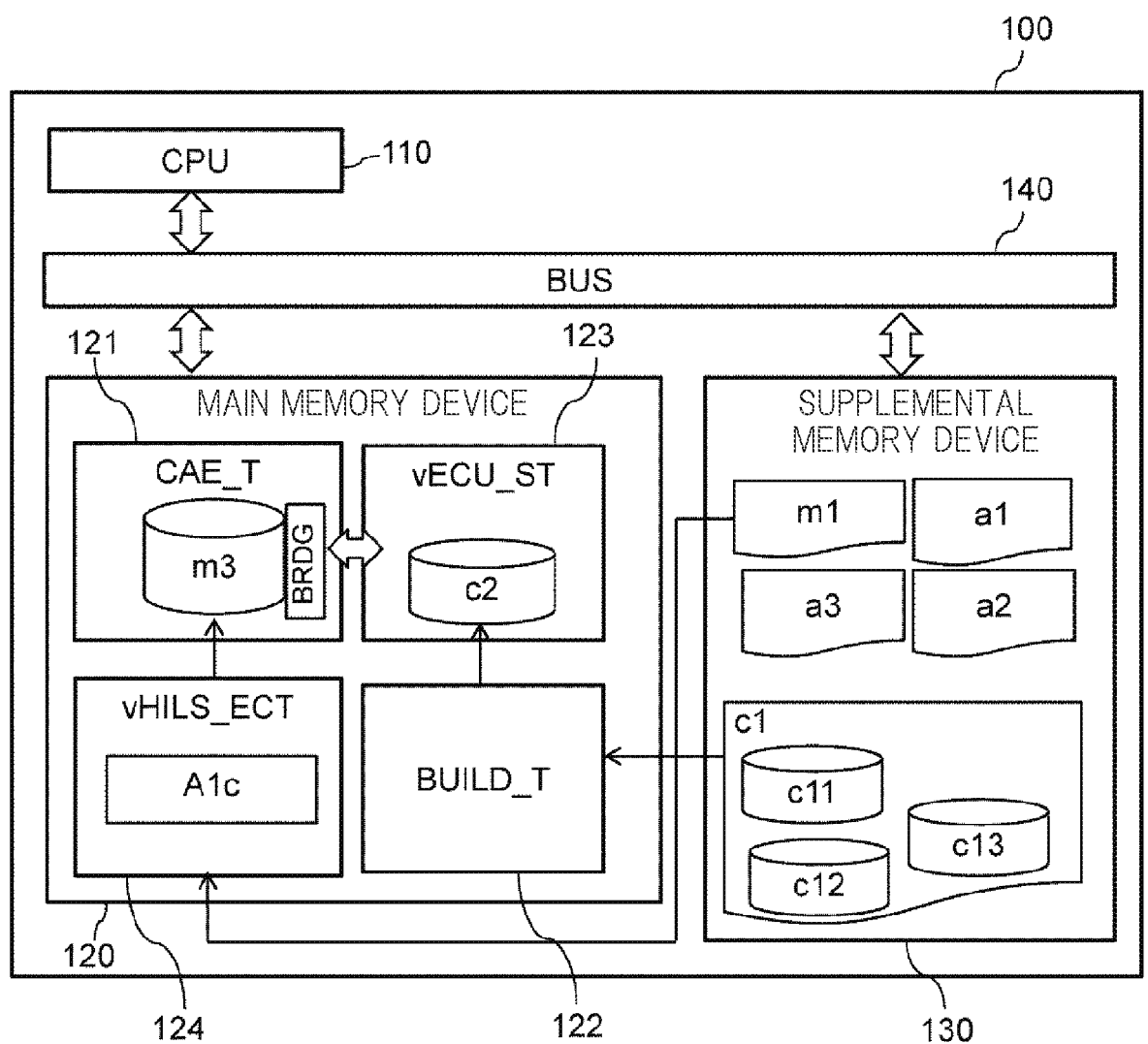
Figure 18:
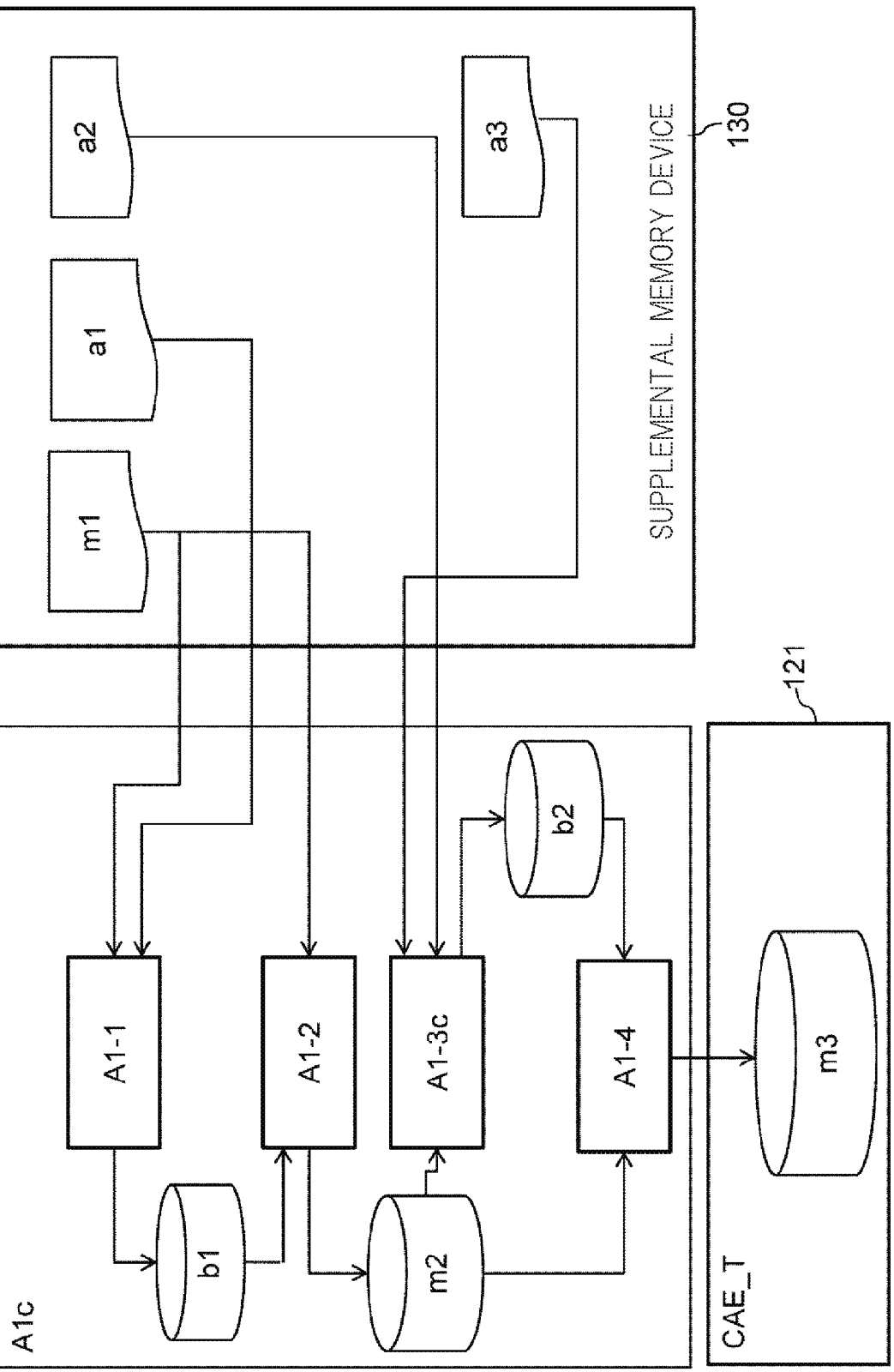
Figure 19:
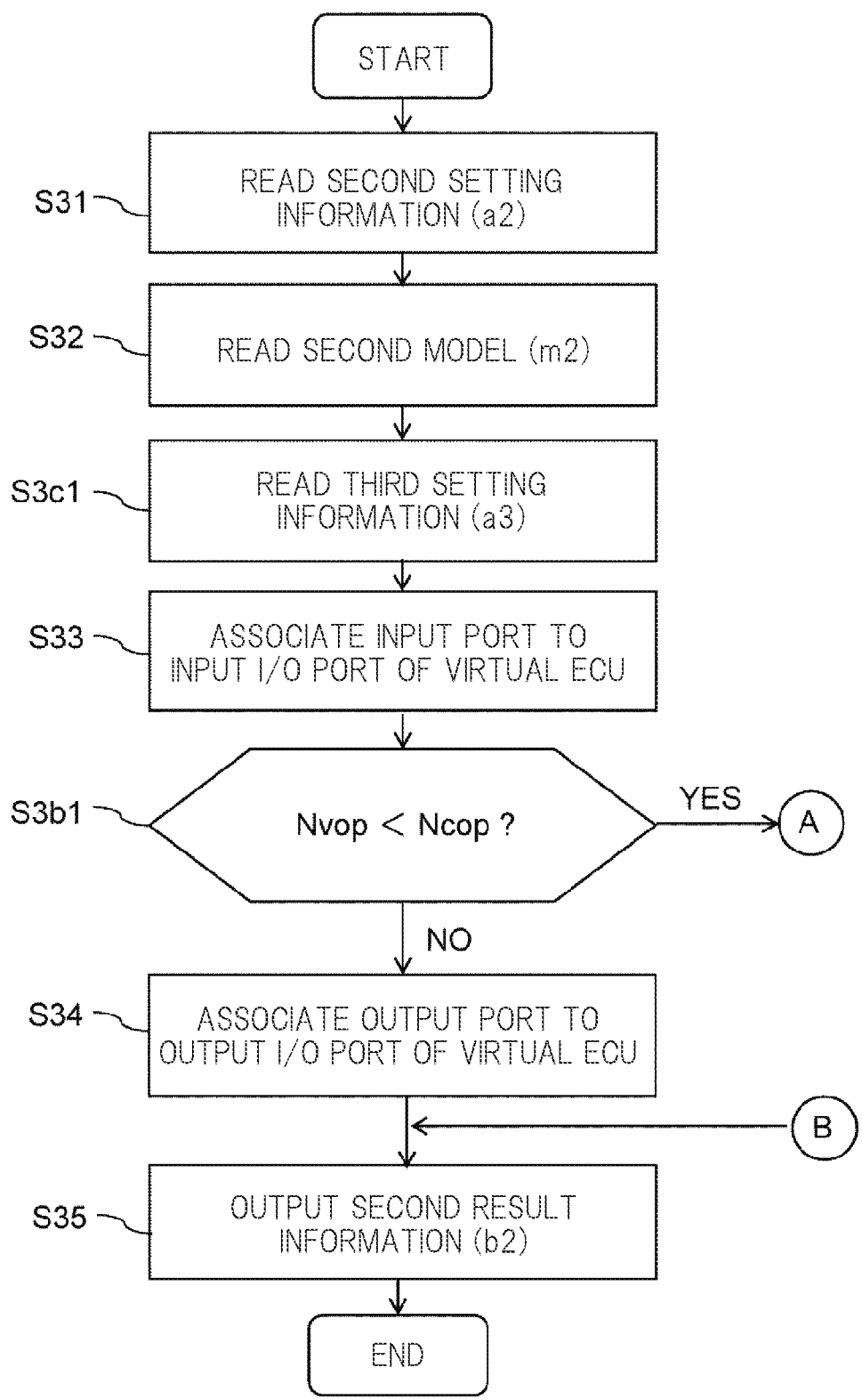
Figure 20:
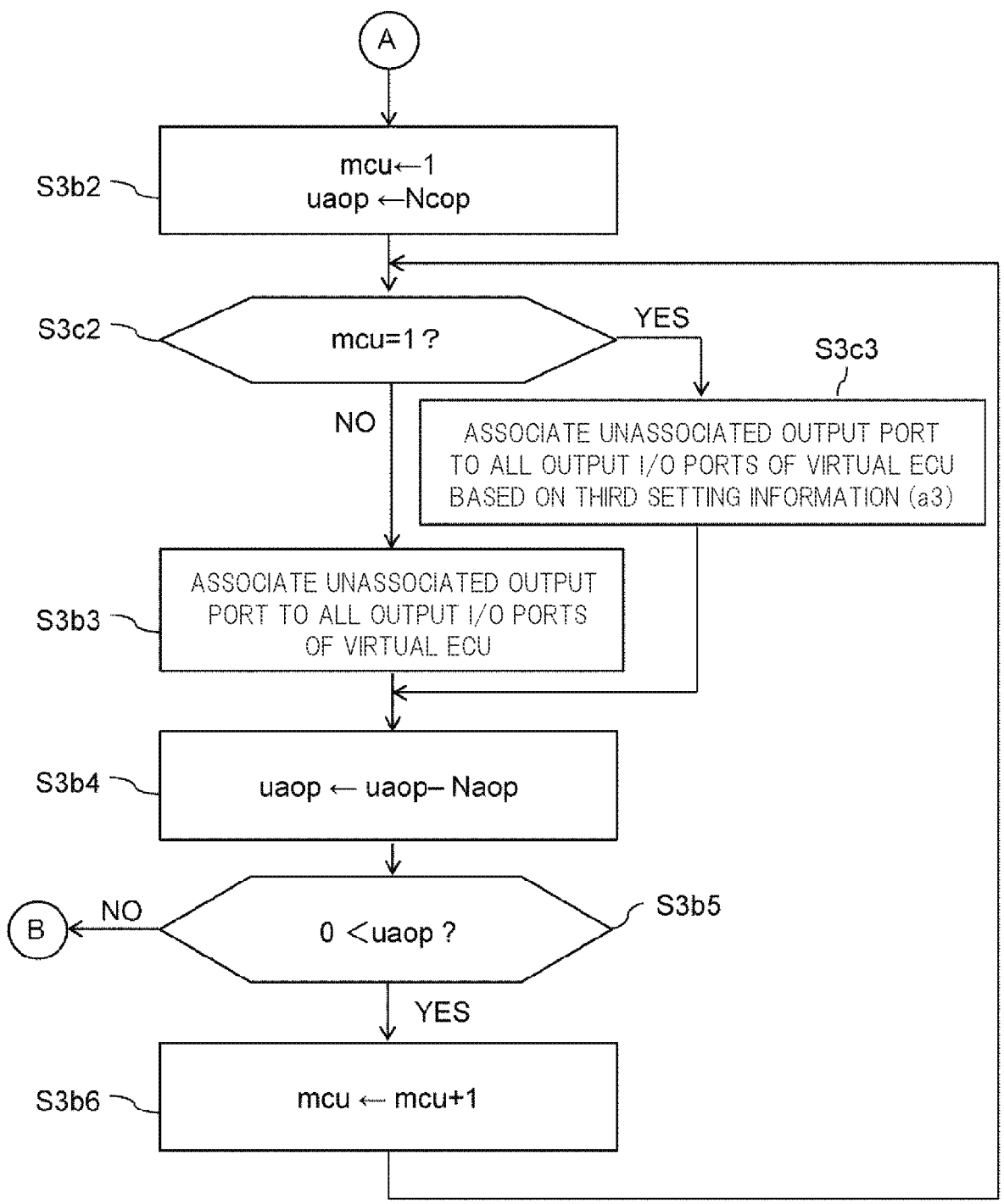

FIG. 1 is a diagram illustrating a vHILS configuration.
FIG. 2 is a diagram illustrating a bridge connecting a CAE tool and a virtual ECU simulation tool.
FIG. 3 is a diagram showing a configuration example of a virtual developmental environment apparatus in a comparative example.
FIG. 4 is a diagram showing a configuration example of a virtual developmental environment apparatus according to a first embodiment.
FIG. 5 is a diagram for explaining a configuration and a process of vHILS infrastructure management tool shown in FIG. 4.
FIG. 6 is a diagram showing a configuration example of a virtual developmental environment apparatus according to a second embodiment.
FIG. 7 is a diagram for explaining a configuration and a process of vHILS infrastructure management tool shown in FIG. 6.
FIG. 8 is a diagram illustrating a configuration of a MILS modeling in a third embodiment.
FIG. 9 is a diagram illustrating a configuration of a vHILS when an output I/O port is insufficient in MILS modeling shown in FIG. 8.
FIG. 10 is a diagram illustrating a vHILS in the third embodiment.
FIG. 11 is a diagram illustrating a configuration example of a virtual developmental environment apparatus according to the third embodiment.
FIG. 12 is a diagram for explaining a configuration and a process of a vHILS infrastructure management tool shown in FIG. 11.
FIG. 13 is a flowchart showing a processing of the I/O port setting unit shown in FIG. 12.
FIG. 14 is a flowchart showing a processing of the I/O port setting unit shown in FIG. 12.
FIG. 15 is a diagram illustrating a configuration of a vHILS when there is a shortage of input I/O ports in MILS modeling shown in FIG. 8.
FIG. 16 is a diagram showing a configuration example of a vHILS in a modification of the third embodiment corresponding to MILS model shown in FIG. 8.
FIG. 17 is a diagram showing a configuration example of a virtual developmental environment apparatus according to a modification of the third embodiment.
FIG. 18 is a diagram for explaining a configuration and a process a vHILS infrastructure management tool shown in FIG. 17.
FIG. 19 is a flowchart showing a processing of the I/O port setting unit shown FIG. 17.
FIG. 20 is a flowchart showing a processing of the I/O port setting unit shown in FIG. 17.

DETAILED DESCRIPTION

The following embodiments, examples and modifications will be described with reference to the drawings. However, in the following description, the same components may be denoted by the same reference numerals and repeated descriptions there of may be omitted.

First, an operation of constructing a vHILS environment from a MILS environment will be described with reference to FIGS. 1 and 2.

In MILS environment, the function of the control unit and the function of the control object called the plant are modeled, and the combined MILS model is created. Then, MILS model is verified by simulating MILS model using the CAE tool (CAE_T). For example, as shown in FIG. 1, MILS model has three blocks of a controller block (CNTR) implementing the control, a plant block to be controlled (PLNT) and a delay block (DLY). And, in order to realize a loop simulation, each of these three blocks is connected annularly by signal lines to each other.

In vHILS environment, the CAE tool (CAE_T) and a virtual ECU simulation tool (vECU_ST) are connected, and the CAE tool (CAE_T) and the virtual ECU simulation tool (vECU_ST) simulate together. Therefore, a bridge (BRDG) is created to connect MILS model to the virtual ECU simulation tool (vECU_ST). Then, vHILS model is created by replacing the bridge (BRDG) with the controller block (CNTR) of MILS model. And, the source code of the software program (program which realizes the function of the controller block) generated from the controller block (CNTR) of the verified MILS model is built. Then, the built load module is downloaded to the virtual ECU simulation tool (vECU_ST) and used in the simulation of the virtual ECU.

As shown in FIG. 2, the virtual ECU (vECU) to be verified by the virtual ECU simulation tool (vECU_ST) includes a ROM (Read Only Memory) for storing the downloaded load module, an input I/O port (I1), an output I/O port (O1), and the like. The bridge (BRDG) shown in FIG. 1 is composed of an output bridge and an input bridge. As shown in FIG. 2, the output bridge connects the input port (in1) of the controller block and the input I/O port (I1) used for input to the virtual ECU (vECU). The input bridge connects the output port (out1) of the controller block (CNTR) and the output I/O port (O1) used for output from the virtual ECU (vECU).

Subsequently, in order to clarify the present embodiment, a configuration of the virtual developmental environment apparatus in the comparative example will be described with reference to FIG. 3.

A virtual developmental environment apparatus 100 in a comparative example includes a CPU (central processing unit) 110, a main memory 120, an auxiliary storage device 130, and a bus (BUS) 140 connecting them. The main memory 120 stores a CAE tool (CAE_T) 121, a build tool (BUILD_T) 122, and a virtual ECU simulation tool (vECU_ST) 123. The auxiliary storage device 130 stores vHILS modeling and a set of source codes (c1).

The CAE tool 121 is a tool for performing simulations using a MILS model or a vHILS model. The virtual ECU simulation tool 123 is a tool for simulating a virtual ECU (vECU).

A user prepares a set of source codes (c1) and stores it in the auxiliary storage device 130. The source code set (c1) includes the source code (c11) of the application program running in the virtual ECU (vECU) generated from MILS model and the source code (c12, c13) of the driver that initializes the input and output I/O ports. The build tool 122 generates a load module (c2) from a set of source code (c1). The user also prepares vHILS modeling and stores it in the auxiliary storage device 130.

In the virtual developmental environment apparatus in the comparative example, the user needs to manually place the bridge (BRDG) in MILS model.

In addition, the user must manually configure the bridge (BRDG) to connect the signal lines of the virtual ECU (vECU) I/O ports. The user performs these tasks to create a vHILS modeling and store in auxiliary storage device 130.

Subsequently, an embodiment will be described below. The virtual developmental environment apparatus according to the embodiment includes a vHILS infrastructure construction tool for the comparative example. Then, the user newly prepares a block name information as first setting information of the controller block (CNTR) and I/O port information as second setting information. The vHILS infrastructure construction tool automatically allocates bridges (BRDG) and connects bridges (BRDG).

Thus, the embodiment arranges the bridge (BRDG) based on the block name information and I/O port information of the controller block (CNTR), and can be performed automatically as a whole formally until the setting of the bridge (BRDG). Thus, vHILS can be constructed automatically by connecting the CAE-tool (CAE_T) and the virtual ECU simulation tool (vECU_ST). For users, the time required to place and configure the bridges (BRDG) can be reduced. Also, when there is an increase or decrease in the number of signal lines used due to a change in MILS modeling, the time required for changing the arrangement and resetting of the bridges (BRDG) can be reduced.

In the following, a specific example of the embodiment will be described using a first embodiment, a second embodiment, and a third embodiment.

First Embodiment

A configuration of a virtual developmental environment apparatus according to the first embodiment will be described with reference to FIG. 4.

A virtual developmental environment apparatus 100 includes a CPU 110, a main memory 120 as a first memory, an auxiliary storage device 130 as a second memory, and a bus 140 connecting them. The CPU 110 and main memory 120 comprise a processing unit. The virtual developmental environment apparatus 100 may be configured to include a variety of input devices, displays, communication interfaces, and the like. Various input devices are devices for receiving an operation input to the virtual developmental environment apparatus 100. Various input devices are, for example, a keyboard, a button and a mouse. The display is a device for displaying various kinds of information. The communication interface is a device that communicates various types of data with external devices.

The virtual developmental environment apparatus 100 is, for example, a stationary personal computer with a display. However, the virtual developmental environment apparatus 100 is not limited to this, and may be any device having a function described later. The virtual developmental environment apparatus 100 may be, for example, a laptop personal computer.

CPU 110 reads various programs including an operating system (Operating System) and an application program installed in the auxiliary storage device 130.

Then, the CPU 110 executes while expanding the read program to the main memory 120.

The main memory 120 is typically a volatile storage medium such as a SDRAM (Synchronous Dynamic Random Access Memory). The main memory 120 holds various work data necessary for executing various programs in addition to the code of various programs including the OS executed by the CPU 110. The auxiliary storage device 130 is a non-volatile storage medium such as a hard disk or a Solid State Drive (SSD). The auxiliary storage device 130 holds various kinds of design information in addition to various programs including the OS. Incidentally, the main memory 120 and the auxiliary storage device 130 may be collectively referred to as a memory.

A CAE tool (CAE_T) 121, a build tool (BUILD_T) 122, a virtual ECU simulation tool (vECU_ST) 123, and a vHILS infrastructure management tool (vHILS_ECT) 124 are software programs stored in the main memory 120 and the auxiliary storage device 130. Incidentally, in FIG. 4, each tool is shown in a storage state at the time of execution.

The CAE tool 121 is a tool for performing simulations using a MILS model or a vHILS model. The build tool 122 is a tool that individually defines and executes the tasks that make up the build, such as parsing, compiling, linking, and running tests. The build tool 122 generates the load module (c2) from the source code (c1). The virtual ECU simulation tool 123 is a tool for simulating virtual ECUs (vECU). A vHILS infrastructure management tool 124 is a tool for constructing vHILS infrastructure. The vHILS infrastructure management tool 124 includes a MILS modeling analysis unit A1.

Prior to processing by the vHILS infrastructure management tool 124, the user prepares a MILS model (m1) running on the CAE tool 121 and stores it in the auxiliary storage device 130. As described above, MILS model (m1) has a controller block (CNTR) implementing the control and a plant block (PLNT) to be controlled, and the like.

The user prepares the first setting information (a1) and the second setting information (a2) and stores them in the auxiliary storage device 130. The first setting information (a1) is a name assigned to the controller block (CNTR) among the blocks included in MILS model (m1), and is block name information of the controller block (CNTR). The second setting information (a2) is I/O port information that lists the I/O ports that can be used in the virtual ECU (vECU).

Further, the user prepares a set of source codes (c1) and stores it in the auxiliary storage device 130. The source code set (c1) includes an application code (c11), an input I/O port driver (c12), and an output I/O port driver (c13). The application code (c11) is the source code of the application program which runs in the virtual ECU (vECU). The application code c11 is generated from MILS models. The driver of the input I/O port (c12) initializes the I/O port of the virtual ECU (vECU). For example, the driver (c12) configures the I/O port of the virtual ECU (vECU) to be used as an input I/O port. The driver (c13) of the output I/O port is used to initialize the I/O port of the virtual ECU (vECU). For example, the driver (c13) configures the I/O port of the virtual ECU (vECU) to be used as an output I/O port. The driver (c12) and driver (c13) are created by the user. The build tool 122 generates a load module (c2) from a set of source code (c1).

The configuration and process of the vHILS infrastructure management tool 124 will be described with reference to FIG. 5.

A MILS model analysis unit A1 includes a model analysis unit A1-1, a bridge arrangement unit A1-2, an I/O port setting unit A1-3, and a bridge port connection unit A1-4.

A process of MILS modeling analysis unit A1 will be described with reference to FIG. 5.

Model Analysis Unit A-1

The model analysis unit A1-1 reads the MILS model (m1) and the first setting information (a1) from the auxiliary storage device 130. The model analysis unit A1-1 acquires a block name of the controller block (CNTR) from the first setting information (a1). Next, the model analysis unit A1-1 analyzes the MILS model (m1) and acquires the names of all the blocks included in the MILS model (m1). The model analysis unit A1-1 searches the names of all the acquired blocks that match the block names of the controller block (CNTR), and specifies the controller block (CNTR). The model analysis unit A1-1 specifies the position of the input port and the output port of the controller block (CNTR), and outputs the position as the first result information (b1) to the main memory 120. The first resultant information (b1) is the information of the arrangement position of the bridges (BRDG).

Bridge Arrangement Unit A1-2

A bridge arrangement unit A1-2 reads the MILS model (m1) and the first result information (b1) from the auxiliary storage device 130. The bridge arrangement unit A1-2 acquires the output port information of the controller block (CNTR) from the first result information (b1), and arranges the output bridge to the output port of the controller block (CNTR) is the arrangement position of the bridge (BRDG). The bridge arrangement unit A1-2 acquires the input port information of the first result information (b1) controller block (CNTR) and arranges the input bridge in the input port of the controller block (CNTR) which is the arrangement position of the bridge (BRDG). The bridge arrangement unit A1-2 deletes blocks other than the bridge (BRDG) in the controller block (CNTR). This generates a MILS modeling in which bridges (BRDG) are arranged. The bridge arrangement unit A1-2 outputs MILS model in which the bridge (BRDG) is arranged as a second model (m2) to the main memory 120.

I/O Port Setting Unit A1-3

An I/O port setting unit A1-3 reads the second model (m2) from the main memory 120. The I/O port setting unit A1-3 reads the second setting information (a2) from the auxiliary storage device 130 and acquires information on the usable I/O ports of the virtual ECU (vECU). I/O port setting unit A1-3 maps all the input ports of the controller block (CNTR) to the available I/O ports of the virtual ECU (vECU) to one-to-one output ports. That is, the I/O port setting unit A1-3 associates the input port of the controller block (CNTR) with the input I/O port of the virtual ECU (vECU), and associates the output port of the controller block (CNTR) with the output I/O port of the virtual ECU (vECU). This generates the mapping between the I/O port of the virtual ECU (vECU) and the input port and output port of the controller block (CNTR). The I/O port setting unit A1-3 outputs the association information as the second result information (b2) to the main memory 120.

Bridge Port Connection Unit A1-4

A bridge port connection unit A1-4 reads the second model (m2) and the second result information (b2) from the main memory 120. The bridge port connection unit AI-4 connects the bridge (BRDG) and the virtual ECU simulation tool 123. Specifically, the bridge port connection unit A1-4 obtains the association information between the input I/O port and the output I/O port of the virtual ECU (vECU) and the input port and the output port of the controller block (CNTR) from the second result information (b2). The bridge port connection unit A1-4 associates the input port with the input I/O port in the bridge (BRDG) of the second model (m2) and associates the output port with the output I/O port based on the association information.

That is, the bridge port connection unit A1-4 acquires the input I/O port information of the virtual ECU (vECU) and the input port name of the controller block (CNTR), and connects the input port of the input bridge to the input I/O port for input. The bridge port connection unit A1-4 acquires the output I/O port information of the virtual ECU (vECU) and the output port name of the controller block (CNTR), and connects the output port the output bridge to the output I/O port for output.

This generates a model in which the bridge (BRDG) and the I/O port of the virtual ECU (vECU) are connected in association with each other. The bridge port connection unit A1-4 outputs the model that has been mapped as a vHILS model (m3) to the main memory 120.

According to the first embodiment, the arrangement of the bridges (BRDG) and the connection setting of the bridges (BRDG) required for validation by vHILS are automatically performed. As a result, it is possible for the user to reduce the construction time (effort) of the validation environment by vHILS. And, the error by the user in the vHILS infrastructure construction can be reduced by the automation of vHILS infrastructure construction.

Second Embodiment

Next, a description will be given of a second embodiment. In the second embodiment, the I/O port driver generating unit A2 is further provided in the vHILS infrastructure management tool in the first embodiment, and a driver of the I/O port of the virtual ECU (vECU) is automatically generated.

A configuration of the virtual developmental environment apparatus according to the second embodiment will be described with reference to FIG. 6.

A configuration of the virtual developmental environment apparatus 100 in the second embodiment is the same as that of the first embodiment. However, the vHILS infrastructure construction tool 124 stored in the main memory 120 and the auxiliary storage device 130 includes a MILS model analysis unit A1a and an I/O port driver generation unit A2.

The configuration and process of vHILS infrastructure management tool 124 in the second embodiment will be described with reference to FIG. 7.

The MILS model analysis unit A1a includes a model analysis unit A1-1, a bridge arrangement unit A1-2, a I/O port setting unit A1-3a, and a bridge port connection unit A1-4. In the second embodiment, the model analysis unit A1-1, the bridge arrangement unit A1-2, and the bridge port connection unit A1-4 have the same configuration as in the first embodiment. The I/O port driver generating unit A2 includes a driver generating unit A2-1.

In the second embodiment, the model analysis unit A1-1, the bridge arrangement unit A1-2, and the bridge port connection unit A1-4 perform the same processing as in the first embodiment. The process of the I/O port setting unit A1-3a will be described with reference to FIG. 7.

I/O Port Setting Unit A1-3a

First, similarly to the I/O port setting unit A1-3 of the first embodiment, a I/O port setting unit A1-3a reads the second model (m2) from the main memory 120. The I/O port setting unit A1-3a reads the second setting information (a2) from the auxiliary storage device 130. The I/O port setting unit A1-3a associates the input port and output port of the controller block (CNTR) with the I/O port of the virtual ECU (vECU).

The I/O port setting unit A1-3a outputs the result of the association as the second result information (b2) to the main memory 120.

Next, the I/O port setting unit A1-3a outputs information of the associated I/O port to the main memory 120 as the third result information (b3) and the fourth result information (b4). That is, the I/O port setting unit A1-3 outputs the name of the associated input I/O port as third result information (b3). The I/O port setting unit A1-3 outputs the name of the associated output I/O port as the fourth result information (b4).

I/O Port Driver Generating Unit A2

The driver generating unit A2-1 of the I/O port driver generating unit A2 reads the third result information (b3) from the main memory 120. The driver generating unit A2-1 acquires the name of the input I/O port. The driver generating unit A2-1 generates a driver code for initializing the I/O port for input on the basis of the acquired name of the input I/O port. The driver generating unit A2-1 outputs the driver code as a driver (c12) of the input I/O port to the auxiliary storage device 130.

The driver generating unit A2-1 reads the fourth result information (b4) from the main memory 120. Then, the driver generating unit A2-1 acquires the name of the output I/O port. The driver generating unit A2-1 generates a driver code for initializing the output I/O port driver based on the acquired name of the output I/O port. The driver generating unit A2-1 outputs the driver code as a driver (c13) of the output I/O port to the auxiliary storage device 130.

According to the second embodiment, by automatically creating the driver of the I/O port of the virtual ECU (vECU), the user does not need to create the driver as in the first embodiment. This can reduce the number of steps required to create the driver and the amount of mistakes made by the user when creating the driver.

Third Embodiment

In the first and second embodiments, the number of available I/O ports of the virtual ECU (vECU) is sufficient for the number of input ports and output ports of MILS modeling. In the third embodiment will be described a case where the number of available I/O ports of the virtual ECU (vECU) is insufficient.

A method of configuring a vHILS when the number of available I/O ports of the virtual ECU (vECU) is insufficient for the number of input ports and output ports of MILS model will be described with reference to FIGS. 8 and 9.

As shown in FIG. 8, the controller block (CNTR) is controlled by four plant blocks (PLNT1-PLNT4). The controller block (CNTR) has four input ports (in1-in4) and four output ports (out1-out4). Each of the four output ports (out1-out4) is connected to the input ports (i1-i4) of the four plant blocks (PLNT1-PLNT4). For example, when the number of output I/O ports of the virtual ECU (vECU) two, the output I/O port is insufficient.

Therefore, when the I/O port (IC) of the virtual ECU (vECU) is insufficient, as shown in FIG. 9, the second virtual ECU (vECU2) and LIN (Local Interconnect Network) bus is added to the first virtual ECU (vECU1). Then, by using the I/O port (IC) of the second virtual ECU (vECU2) added together, the shortage of the I/O port is eliminated.

Here, the four input I/O ports (I1-I4) of the first virtual ECU (vECU1) are connected to the four input ports (in1-in4) of the controller block (CNTR) via the output bridge. Two output I/O ports (O3, O4) of the first virtual ECU (vECU1) are connected to two output ports (out3, out4) of the controller block (CNTR) via an input bridge. Two output I/O ports (O1, O2) of the second virtual ECU (vECU2) are connected to two output ports (out1, out2) of the controller block (CNTR) via an input bridge.

Incidentally, two signals processed in the first virtual ECU (vECU1) LIN block for performing communication control according to the standard of the LIN of the first virtual ECU (vECU1), LIN bus and the second virtual ECU (vECU2) via the LIN block is output to the output I/O port (O1, O2) of the second virtual ECU (vECU2). The other two signals processed in the first virtual ECU (vECU1) are output to the output I/O port (O3, O4) of the first virtual ECU (vECU1).

A vHILS in the third embodiment will be described with reference to FIG. 10. In vHILS environment, the controller block (CNTR) of MILS model is simulated by replacing it with the first virtual ECU (vECU1) and the second virtual ECU (vECU2). Therefore, an output bridge is created that connects the input port (in1~in4) of the controller block (CNTR) and the input I/O ports (I1 to I4) of the first virtual ECU (vECU1). Then, an input bridge connecting the output port (out3, out4) of the controller block (CNTR) and the output I/O port (O3, O4) of the first virtual ECU (vECU1) with connecting the output I/O port (O1, O2) of the output port (out1, out2) and the second virtual ECU (vECU2) created.

Then, vHILS model is created by replacing the bridge (BRDG) combined with the output bridge and the input bridge with the controller block (CNTR) of MILS model. The source code of the software program generated from the controller block (CNTR) of MILS model is built and downloaded to ROM of the first virtual ECU (vECU1). vHILS model in the CAE tool (CAE_T) is connected to the first virtual ECU (vECU1) in the first virtual ECU simulation tool (vECU_ST1) and the second virtual ECU (vECU2) in the second virtual ECU simulation tool (vECU_ST2). Then, the CAE tool (CAE_T) and the first virtual ECU simulation tool (vECU_ST1) and the second virtual ECU simulation tool (vECU_ST2) are simulated together.

The configuration of the virtual developmental environment apparatus according to the third embodiment will be described with reference to FIG. 11. The configuration of the virtual developmental environment apparatus 100 in the third embodiment is the same as that of the first embodiment. However, vHILS infrastructure management tool 124 stored in the main memory 120 has a MILS modeling analysis unit A1b.

The configuration and process of MILS modeling analysis unit in the third embodiment will be described with reference to FIG. 12.

The MILS model analysis unit A1b includes a model analysis unit A1-1, a bridge arrangement unit A1-2, I/O port setting unit A1-3b, and a bridge port connection unit A1-4. The model analysis unit A1-1, the bridge arrangement unit A1-2, and the bridge port connection unit A1-4 in the third embodiment have the same configuration as in the first embodiment. The model analysis unit A1-1, the bridge arrangement unit A1-2, and the bridge port connection unit A1-4 in the third embodiment are the same as those in the first embodiment.

The process of the I/O port setting unit A1-3b will be described with reference to FIGS. 13 and 14.

As shown in FIG. 13, the I/O port setting unit A1-3 reads the second setting information (a2) from the auxiliary storage device 130 (step S31). The I/O port setting unit A1-3b reads the second model (m2) from the main memory 120 (step S32). Then, the I/O port setting unit A1-3 associates one input port of the controller block (CNTR) for one input I/O port of the virtual ECU (vECU), and performs this association to all the input ports (step S33).

Next, the I/O port setting unit A1-3 compares the number of output I/O ports (Nvop) of the virtual ECU (vECU) with the number of output ports (Ncop) of the controller block (CNTR) (step S3b1).

When the number of output I/O ports (Nvop) of the virtual ECU (vECU) is equal to or greater than the number of output ports (N cop), the I/O port setting unit A1-3 associates the output ports of the controller block (CNTR) one by one to all the output I/O ports of the virtual ECU (vECU) (step S34). The I/O port setting unit A1-3b outputs the result of the association as a second result information (b2) (step S35). Incidentally, the process of the I/O port setting unit A1-3 in the first embodiment is performed by the steps S31, S32, S33, S34, and S35.

If the number of output I/O ports (Nvop) of the virtual ECU (vECU) is less than the number of output ports (Ncop), as shown in FIG. 14, the I/O port setting unit A1-3 sets 1 to the variable (mcu) and sets the number of output I/O ports (Ncop) to be used for the variable (uaop) (step S3b2).

The I/O port setting unit A1-3 associates the output ports of the controller block (CNTR) one by one to all the output I/O ports of the virtual ECU (vECU) (step S3b3). The I/O port setting unit A1-3 excludes the associated output port from the target of the unassociated output port. That is, I/O port setting unit A1-3 subtracts the number of output I/O ports (Naop) of the virtual ECU (vECU) allocated from the variable (uaop) (step S3b4).

Subsequently, the I/O port setting unit A1-3 compares the variable (uaop) and "0" to determine whether the output port is not associated remains (step S3b5).

The I/O port setting unit A1-3 adds one virtual ECU (vECU) and adds "1" to the variable (mcu) when there are remaining output ports that have not been mapped (uaop>0) (step S3b6). The I/O port setting unit A1-3 associates the output ports of the controller block (CNTR) one by one to all the output I/O ports of the added virtual ECU (vECU) (step S3b3). This is done until all output ports are mapped to output I/O ports. I/O port setting unit A1-3, if there is no output port is not mapped (uaop=0), proceeds the process to step S35 shown in FIG. 13.

A method of configuring a vHILS when the number of available input I/O ports of the virtual ECU (vECU) is insufficient for the number of input ports of MILS model will be described with reference to FIGS. 8 and 15.

As shown in FIG. 8, when the number of input ports and output ports of the controller block (CNTR) is four by one, when the number of input I/O ports of the virtual ECU (vECU) is two, the input I/O port insufficient.

Therefore, when the input I/O port of the virtual ECU (vECU) insufficient, as shown in FIG. 15, to add a second virtual ECU (vECU2) in addition to the first virtual ECU (vECU1). Then, the I/O port of the second virtual ECU (vECU2) added is also used together to eliminate the shortage of I/O ports.

Here, the two input I/O ports (I3, I4) of the first virtual ECU (vECU1) is connected to the two input ports (in3, in4) of the controller block (CNTR) via the output bridge. Four output I/O ports (O1-O4) of the first virtual ECU (vECU1) are connected via an input bridge to four output ports (out1-out4) of the controller block (CNTR). Two input I/O ports (I1, I2) of the second virtual ECU (vECU2) are connected to two input ports (in1, in2) of the controller block (CNTR) via an output bridge.

The two signals input to the I/O port (IO) of the second virtual ECU (vECU2) are processed by the first virtual ECU (vECU1) through the LIN block of the second virtual ECU (vECU2), the LIN bus, and the first virtual ECU (vECU1). The two signals input to the I/O ports (IOs) of the first virtual ECU (vECU1) are processed in the first virtual ECU (vECU1). The four signals processed in the first virtual ECU (vECU1) are output to the output I/O ports (O1-O4) of the first virtual ECU (vECU1).

I/O port setting unit A1-3b performs the same processing as when the output I/O port is insufficient even if the input I/O port is insufficient, and outputs as third result information (b3).

According to the third embodiment, even when the shortage of the I/O ports of the virtual ECU (vECU) occurs, it is possible to automatically eliminate the shortage of the I/O ports, it is possible to reduce the handling man-hour when dealing with the shortage of I/O ports. In addition, the target specification of the ECU to be used can be determined by clarifying the number of I/O ports required in a study before determining the ECU to be used.

Modification of Third Embodiment

In the third embodiment, when the number of I/O ports is insufficient, an example in which I/O ports of a plurality of virtual ECUs (vECU) are used together has been described. If there is more than one controlled object (plant), it may be desirable for a particular plant to be controlled by a single ECU.

For example, when a plurality of control objects need to operate simultaneously, the ECU must output a signal at the same time. If there are multiple such combinations or equivalent or similar controlled objects, they are likely to be located close to each other on the wiring. In addition, if there is a dependence on the control object (if the control target has a priority), such as a case of driving another control object after driving a certain control object in a plurality of control objects, the ECU must maintain the timing difference and output the signal.

In this modification, these multiple control objects are allocated to one ECU preferentially in these cases.

A method of configuring a vHILS in a modification when the number of available output I/O ports of the virtual ECU (vECU) is insufficient for the number of output ports of MILS model will be described with reference to FIGS. 8 and 16.

As shown in FIG. 8, when the number of input ports and output ports of the controller block (CNTR) is four by one, when the number of output I/O ports of the virtual ECU (vECU) is two, the output I/O port is insufficient. Here, the second plant block (PLNT2) and the fourth plant block (PLNT4) surrounded by a dashed line in FIG. 8 is a control object having a priority.

Therefore, when the I/O port of the virtual ECU (vECU) is insufficient, the second virtual ECU (vECU2) and the LIN bus are added to the first virtual ECU (vECU1) considering the priority as shown in FIG. 16. The I/O port of the second virtual ECU (vECU2) added can be used together to eliminate the shortage of I/O ports.

When mapping the I/O ports of the virtual ECU (vECU) to the input ports and output ports of the controller block (CNTR), for example, prioritizes the placement of the plant near the ECU. For example, as shown in FIG. 16, since the second plant block (PLNT2) and the fourth plant block (PLNT4) are arranged close to each other, the second plant block (PLNT2) and the fourth plant block (PLNT4) are controlled by the same first virtual ECU (vECU1). Since there are no placement restrictions on the first plant block (PLNT1) and the third plant block (PLNT3), it is controlled by the second virtual ECU (vECU2).

Here, the four input I/O ports (I1-I4) of the first virtual ECU (vECU1) are connected to the four input ports (in1-in4) of the controller block (CNTR) via the output bridge. Two output I/O ports (O2, O4) of the first virtual ECU (vECU1) are connected to two output ports (out2, out4) of the controller block (CNTR) via an input bridge. Two output I/O ports (O1, O3) of the second virtual ECU (vECU2) are connected to one output port (out1, out3) of the controller block (CNTR) via an input bridge.

The two signals processed in the first virtual ECU (vECU1) are output to the output I/O port (O1, O3) of the second virtual ECU (vECU2) through the LIN block of the LIN block of the first virtual ECU (vECU1), the LIN bus, and the LIN block of the second virtual ECU (vECU2).

The other two signals processed in the first virtual ECU (vECU) are output to the output I/O port (O2, O4) of the first virtual ECU (vECU1).

The configuration and processing the virtual developmental environment apparatus according to the present modification will be described with reference to FIG. 17.

The configuration of the virtual developmental environment apparatus 100 in this modification is the same as the third embodiment. However, vHILS infrastructure management tool 124 stored in the main memory 120 includes a MILS modeling analysis unit A1c. Further, in addition to MILE model (m1), the first setting information (a1) and the second setting information (a2), the third setting information (a3) is stored in the auxiliary storage device 130. The third setting information (a3) the information of the plant block (PLNT) that is allocated preferentially to the I/O port of one virtual ECU (ECU), that is, the output port of the controller block (CNTR), also referred to as the preferred port information.

The configuration of MILS model analysis unit in this modification will be described with reference to FIG. 18. The MILS model analysis unit A1c includes a model analysis unit A1-1, a bridge arrangement unit A1-2, an I/O port setting unit A1-3c, and a bridge port connection unit A1-4. The model analysis unit A1-1, the bridge arrangement unit A1-2, and the bridge port connection unit A1-4 in the third embodiment has the same configuration as in the third embodiment.

The process of the MILS modeling analysis unit A1c in this modification will be described with reference to FIG. 18.

The model analysis unit A1-1, the bridge arrangement unit A1-2, and the bridge port connection unit A1-4 in this modification are the same as in the first embodiment.

A process of the I/O port setting unit A1-3c will be described with reference to FIGS. 19 and 20.

As shown in FIG. 19, the steps S31, S32, S33, S34, and S35 of this modification is the same as the process of the third embodiment. Further, as shown in FIG. 20, the steps S3b2, S3b3, S3b4, S3b5, and S3b6 of this modification is the same as the process of the third embodiment. Hereafter, different processing from the third embodiment will be described.

As shown in FIG. 19, the I/O port setting unit A1-3 reads the third setting information (a3) prior to a step S3c3 described later.

As shown in FIG. 20, after the step S3b2, the I/O port setting unit A1-3 compares the variable (mcu) and "1" (step S3c2). The I/O port setting unit A1-3 assigns an unassociated output port to all output I/O ports of the virtual ECU (vECU) based on the third setting information (a3) (step S3c3) when the first virtual ECU (vECU) assigned to the I/O ports.

When the second and subsequent virtual ECUs (vECU) are assigned to I/O ports, the I/O port setting unit A1-3 associates an output port that is not supported by all the output I/O ports of the virtual ECU (vECU) (step S3c3).

For example, when multiple plants are close to each other, by controlling them with the same ECU, it is possible to shorten the routing at the time of ECU mounting. As a result, the shortage of I/O ports can be eliminated considering performance improvement such as improvement of execution speed and reduction of cost.

A program for executing the processing described in the above-described embodiment may be recorded on a magnetic disk such as an HDD attached to a computer, an optical disk such as a CD, a magnetic-optical disk such as a MO, and a non-temporary computer readable recording medium such as a solid state memory such as a USB memory, and provided as a program product. Alternatively, a program may be provided by recording on a recording medium such as a hard disk built in the computer. Programs can also be provided by downloading over a network.

While the disclosure made by the disclosers has been specifically described based on the embodiments, examples, and modifications, it is needless to say that the present disclosure is not limited to the above-described embodiments, examples, and modifications, and various modifications can be made without departing from the scope of the present invention.

What is claimed is:

1. A virtual developmental environment apparatus that performs vHILS (Virtual Hardware In the Loop Simulation) by simulating a MILS (Model In the Loop Simulation) model and jointly simulating a virtual ECU (Electronic Control Unit), the apparatus comprising:
   a processing execution unit including a central processing unit and a first memory; and
   a second memory for storing:
      the MILS model including a controller block including an input port and an output port and a plant block to be controlled by the controller block;
      a first setting information for identifying a controller block in the MILS model;
      a program for realizing a function of the controller block to be used when executing a simulation of the virtual ECU; and
      a second setting information for storing a list of I/O (Input/Output) ports available in the virtual ECU,
   wherein the processing execution unit is configured to:
      specify a controller block in the MILS model based on the first setting information;
      arrange a bridge for connecting the input port and the output port and the I/O port of the virtual ECU to the input port and the output port of the identified controller block; and connect the bridge and the I/O port of the virtual ECU based on the second setting information.

2. The virtual developmental environment apparatus according to claim 1,
   wherein the I/O port of the virtual ECU includes an input I/O port and an output I/O port,
   wherein the processing execution unit is configured to:
      generate a position of the input port and the output port of the identified controller block as first result information;
      generate a second model in which the bridge is arranged on the output port and the input port based on the first result information;
      generate second result information in which the input port or the output port is associated with the I/O port of the virtual ECU based on the second setting information and the second model; and
      generate a vHILS model in which the input port and the output I/O port and the output I/O port in the bridge are respectively connected based on the first result information and the second result information.

3. The virtual developmental environment apparatus according to claim 2,
   wherein the processing execution unit is configured to:
      acquire a block name of the controller block based on the first setting information;
      acquire the block names of all blocks in the MILS model; and
      retrieve and specify a controller block in the MILS model based on the acquired block name.

4. The virtual developmental environment apparatus according to claim 3,
   wherein processing execution unit is configured to:
      acquire output port information of the controller block from the first result information;
      arrange an input bridge on the output port of the controller block based on the acquired output port information;
      acquire input port information the controller block from the first result information;
      arrange an output bridge on the input port of the controller block based on the acquired input port information; and
      delete blocks other than the input bridge and the output bridge in the controller block to generate the second model.

5. The virtual developmental environment apparatus according to claim 4,
   wherein the processing execution unit is configured to associate the input port with an input I/O port of the virtual ECU based on the second setting information and the second model, and to generate the second result information by associating the output port with an output I/O port of the virtual ECU.

6. The virtual developmental environment apparatus according to claim 5,
   wherein the processing execution unit is configured to:
      acquire input I/O port information and an input port name from the second model and the second result information;
      connect the input port and the input I/O port in the output bridge based on the acquired input I/O port information and the input port name;
      acquire output I/O port information and an output port name from the second model and the second result information; and connect the output port and the output I/O port in the input bridge based on the acquired output I/O port information and the output port name to generate vHILS model.

7. The virtual developmental environment apparatus according to claim 5,
wherein the processing execution unit is configured to:
acquire the association information in which the I/O port of the virtual ECU is associated with the input port or the output port; and
generate a driver code for initializing the I/O port based on the association information.

8. The virtual developmental environment apparatus according to claim 7,
wherein the association information is a name of an input I/O port associated with the input port and a name of an output I/O port associated with the output port, and
wherein the processing execution unit is configured to:
generate an input driver code for initializing the input I/O port based on the name of the input I/O port; and
generate an output driver code for initializing the output I/O port based on the name of the output I/O port.

9. The virtual developmental environment apparatus according to claim 2,
wherein, the processing execution unit is configured to:
associate the input port with an input I/O port of the virtual ECU based on the second setting information and the second model;
add a virtual ECU when the number of output I/O ports of the virtual ECU is less than the number of output ports; and
associate the output port with the output I/O port of the virtual ECU and the output I/O port of the added virtual ECU based on the second setting information and the second model to generate the second result information.

10. The virtual developmental environment apparatus according to claim 9,
wherein the second memory further stores third setting information that specifies an output port that is preferentially connected to an I/O port of the virtual ECU, and
wherein the processing execution unit is configured to generate the second result information by associating the output I/O port of the virtual ECU and the output I/O port of the added virtual ECU based on the second setting information, the second model, and the third setting information.

11. A method executed in a virtual developmental environment apparatus comprising a central processing unit and a memory executing a simulation of a MILS (Model In the Loop Simulation) model and a simulation of a virtual ECU (Electronic Control Unit) perform vHILS (Virtual Hardware In the Loop Simulation) in cooperation, the method comprising the steps of:
storing, in the memory, the MILS model including controller block that includes an input port and an output port and a plant block to be controlled by the controller block, first setting information for specifying a controller block in MILS model, a program for realizing a function of the controller block to be used when executing a simulation of the virtual ECU, and second setting information describing a list of I/O (Input/Output) ports usable in the virtual ECU are stored;
specifying a controller block in MILS model based on the first setting information;
arranging a bridge for connecting the input port and the output port and the I/O port of the virtual ECU on the input port and the output port of the identified controller block; and connecting the I/O ports of the bridge and the virtual ECU based on the second setting information.

12. A non-transitory computer-readable recording medium that stores a program to be executed in a virtual developmental environment apparatus that includes a central processing unit and a memory, and performs vHILS (Virtual Hardware In the Loop Simulation) by simulating a MILS (Model In the Loop Simulation) model and jointly simulating a virtual ECU (Electronic Control Unit), the memory storing the MILS model that includes a controller block including an input port and an output port and a plant block to be controlled by the controller block, first setting information for identifying a controller block in the MILS mode, a program for realizing a function of the controller block to be used when executing a simulation of the virtual ECU, and second setting information describing a list of I/O (Input/Output) ports usable in the virtual ECU, the program performing a method comprising the steps of:
specifying a controller block in the MILS model based on the first setting information; arranging a bridge for connecting the input port and the output port and the I/O port of the virtual ECU the input port and the output port of the identified controller block; and
connecting the bridge and the I/O port of the virtual ECU based on the second setting information.

* * * * *